United States Patent
Ding et al.

(10) Patent No.: US 9,065,389 B2
(45) Date of Patent: Jun. 23, 2015

(54) RADIO FREQUENCY POWER AMPLIFIER WITH NO REFERENCE VOLTAGE FOR BIASING AND ELECTRONIC SYSTEM

(71) Applicant: ADVANCED SEMICONDUCTOR ENGINEERING INC., Kaohsiung (TW)

(72) Inventors: Jaw-Ming Ding, Taoyuan County (TW); Hsin Chin Chang, Taipei (TW)

(73) Assignee: ADVANCED SEMICONDUCTOR ENGINEERING INC., Kaohsiung (TW)

( * ) Notice: Subject to any disclaimer, the term of this patent is extended or adjusted under 35 U.S.C. 154(b) by 36 days.

(21) Appl. No.: 13/975,535

(22) Filed: Aug. 26, 2013

(65) Prior Publication Data

US 2014/0327482 A1    Nov. 6, 2014

(30) Foreign Application Priority Data

May 3, 2013    (TW) .............................. 102115861 A

(51) Int. Cl.
   *H03F 3/04*    (2006.01)
   *H03F 3/19*    (2006.01)
   *H03F 1/30*    (2006.01)

(52) U.S. Cl.
   CPC .................. *H03F 3/19* (2013.01); *H03F 1/302* (2013.01); *H03F 2200/18* (2013.01); *H03F 2200/447* (2013.01)

(58) Field of Classification Search
   CPC .............................. H03F 3/04; H03F 2200/447

USPC ......................................... 330/285, 289, 296
See application file for complete search history.

(56) References Cited

U.S. PATENT DOCUMENTS

| | | | |
|---|---|---|---|
| 7,564,230 B2 | 7/2009 | Liwinski | |
| 7,869,775 B2 | 1/2011 | Alon et al. | |
| 8,049,483 B2 | 11/2011 | Yamamoto et al. | |
| 8,138,836 B2 | 3/2012 | Matsuzuka et al. | |
| 8,350,418 B2 | 1/2013 | Metzger et al. | |
| 2005/0264363 A1* | 12/2005 | Kang et al. | ..................... 330/289 |
| 2011/0074512 A1 | 3/2011 | Alon et al. | |

* cited by examiner

*Primary Examiner* — Steven J Mottola
(74) *Attorney, Agent, or Firm* — Foley & Lardner LLP; Cliff Z. Liu; Angela D. Murch

(57) ABSTRACT

A radio frequency (RF) power amplifier with no reference voltage for biasing is disclosed. The RF power amplifier includes a three-terminal current source circuit, a current mirror circuit and an output-stage circuit. The three-terminal current source circuit receives a first system voltage and accordingly outputs a first current and a second current, and a source voltage exists between a first output terminal of the first current and a second output terminal of the second current. The current mirror circuit receives the first current and the second current and accordingly generates a bias current. The output-stage circuit receives the bias current so as to work at an operation point. The RF power amplifier utilizes the source voltage of the three-terminal current source circuit so the first system voltage is between a first voltage and a second voltage, and then the output-stage circuit outputs an output current which does not vary with a deviation of the first system voltage also with temperature compensation.

20 Claims, 23 Drawing Sheets

RADIO FREQUENCY POWER AMPLIFIER WITH NO REFERENCE VOLTAGE FOR BIASING AND ELECTRONIC SYSTEM

BACKGROUND OF THE INVENTION

1. Field of the Invention

The present invention relates to a radio frequency power amplifier; in particular, to the radio frequency power amplifier utilizing a three-terminal current source to proceed biasing.

2. Description of Related Art

Handheld devices in a wireless communication, the main direct current (DC) power consumption is from the radio frequency (RF) power amplifier. The RF power amplifier can maintain high linearity without making amplified signal distortion, and simultaneously can present with high efficiency to extend the communication time, so that the RF power amplifier has been a research focus RF power amplifier design. In particular, an orthogonal frequency division multiplexing (OFDM) digital modulation technology widely used in a wireless communication system has obvious characteristics of the time-varying wave packet, its peak value and average power ratio constant (PAPR) is higher than that in conventional wireless communication system. In other words, its wave packet relative to time change is more intense, so the requirements for linearity of the RF power amplifier will be relatively high.

In prior art, the third-generation (3G)/fourth generation (4G) mobile phone system for accuracy of the RF output power has extremely strict requirements. Because voltage value of the phone battery will change significantly, from 3.2 volts to 4.2 volts, therefore the accuracy of the output power for the RF power amplifier will be affected.

SUMMARY OF THE INVENTION

The instant disclosure provides a radio frequency power amplifier, the radio frequency power amplifier comprises a three-terminal current source circuit, a current mirror circuit and an output-stage circuit. The current mirror circuit receives a first current and a second current outputted from the three-terminal current source circuit and accordingly generates a bias current. The output-stage circuit receives the bias current so as to work at an operation point. Through the source voltage of the three-terminal current source circuit, when the first system voltage operates between a first voltage and a second voltage, the output-stage circuit outputs an output current with temperature-compensation which does not vary with changes of the first system voltage.

The instant disclosure another provides an electronic system, the electronic system comprises RF power amplifier and a load coupled to the RF power amplifier. The RF power amplifier receives a RF input signal and outputs a RF output signal to the load.

To sum up, the RF power amplifier and the electronic system of the instant disclosure are able to generate stable output current though the source voltage of the three-terminal current source circuit when the first system voltage, i.e. battery voltage, changes significantly.

For further understanding of the present invention, reference is made to the following detailed description illustrating the embodiments and examples of the present invention. The description is only for illustrating the present invention, not for limiting the scope of the claim.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Power amplifier (PA) module in the prior art uses two set of chip to design, one is a CMOS chip to provide a reference voltage and reference current and a control circuit, another one is GaAs chip to provide power amplifier circuit.

Figure 1:
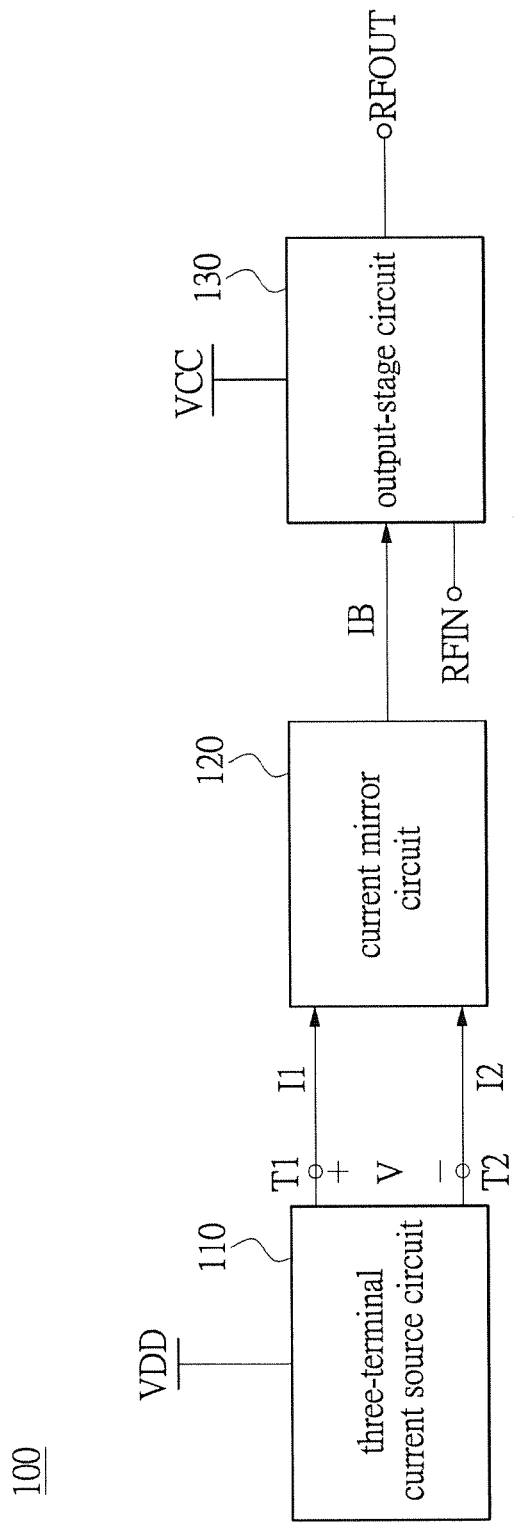
FIG. 1 shows a block diagram of the RF power amplifier according to one embodiment of the instant disclosure.

FIG. 1 shows a block diagram of the RF power amplifier according to one embodiment of the instant disclosure. The RF power amplifier 100 comprises a three-terminal current source circuit 110, a current mirror circuit 120 and an output-stage circuit 130. The three-terminal current source circuit 110 is coupled to the current mirror circuit 120 and the current mirror circuit 120 is coupled to the output-stage circuit 130. The three-terminal current source circuit 110 receives a first system voltage VDD and accordingly outputs a first current I1 and a second current I2. A source voltage V exists between a first output terminal T1 and a second output terminal T2. The current mirror circuit 120 receives the first current I1 via the first output terminal T1 and the second current I2 via the second output terminal T2, and accordingly generates a bias current. Afterwards, the output-stage circuit 130 receives the bias current IB so as to work at an operation point. Through the source voltage V of the three-terminal current source circuit 110, when the first system voltage VDD operates between a first voltage and a second voltage, the output-stage circuit 130 outputs an output current with temperature-compensation which does not vary with changes of the first system voltage VDD. In the direct current (DC) mode, the first current I1 and the second current I2 are transmitted to the current mirror circuit 120 through the three-terminal current source circuit 110, so that when the first system voltage increase to 3.2 volt, the output current may be stabled. In the prior art, the first system voltage need to increase to 3.6 volt at least so as to stable the output current. On the contrary, due to a battery voltage (i.e., the first system voltage VDD) changes between 3.2 volt and 4.2 volt, the instant disclosure may meet the need of communication quality nowadays. Afterwards, after entering alternative current (AC) mode, the RF power amplifier may receives a RF input signal RFIN and enlarges the RF input signal RFIN, and then outputs a RF output signal RFOUT from the output-stage circuit.

In the following embodiments, there are only parts different from embodiments in FIG. 1 described, and the omitted parts are indicated to be identical to the embodiments in FIG. 1. In addition, for an easy instruction, similar reference numbers or symbols refer to elements alike.

Figure 2:
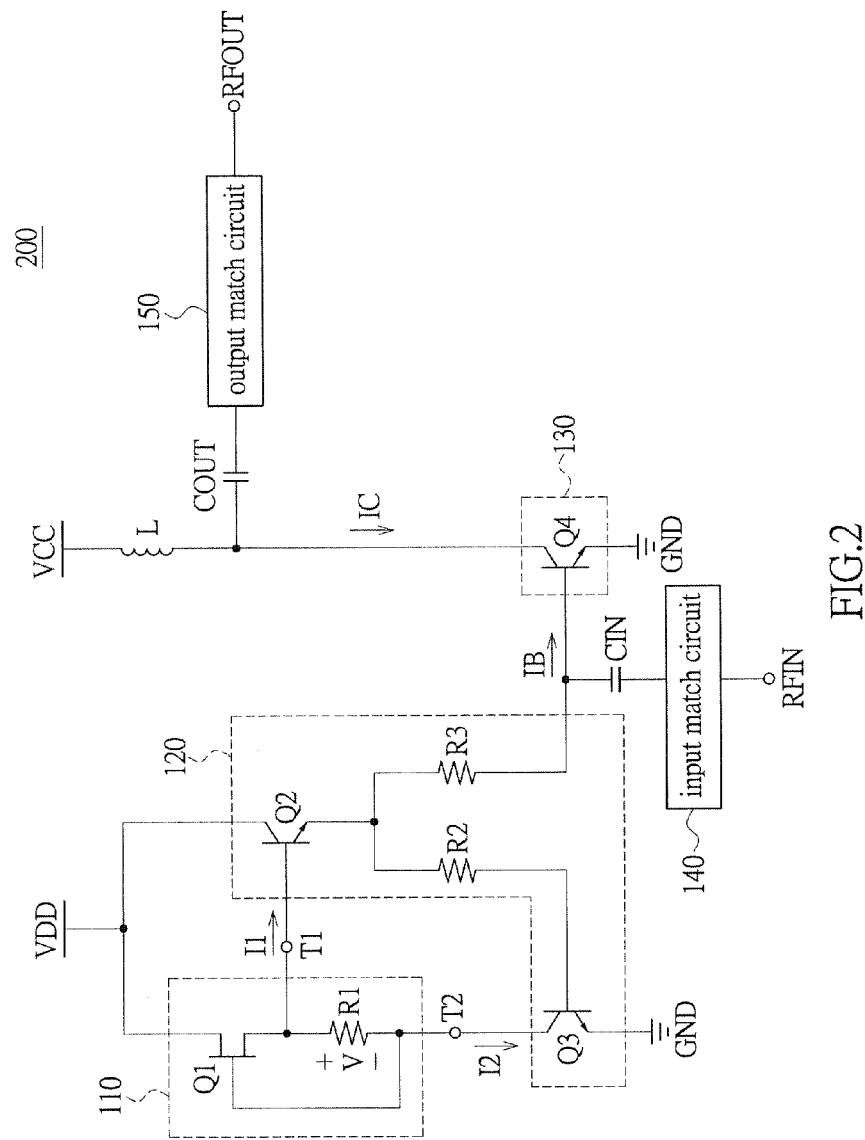
FIG. 2 shows a circuit schematic diagram of the RF power amplifier according to another embodiment of the instant disclosure.

FIG. 2 shows a schematic diagram of the RF power amplifier according to another embodiment of the instant disclosure. The three-terminal current source circuit 110 comprises a first transistor Q1 and a first resistor R1. The current mirror circuit 120 comprises a second transistor Q2, a second resistor R2, a third resistor R3 and a third transistor Q3. The output-stage circuit 130 comprises a fourth transistor Q4. A drain of the first transistor Q1 is coupled to a first system voltage VDD. A terminal of the first resistor R is a first output terminal T1 coupled to a source of the first transistor Q1 and outputting the first current I1. Another terminal of the first resistor R1 is a second output terminal T2 coupled to a gate of the first transistor Q1 and outputting the second current I2. A base of the second transistor Q2 is coupled to a terminal of the first resistor R1 so as to receive the first current I1, and a collector of the second transistor Q2 is coupled to the first system voltage VDD. A terminal of the second resistor R2 is coupled to an emitter of the second transistor Q2, a terminal of the third resistor R3 is coupled to an emitter of the second transistor Q2, a base of the third transistor Q3 is coupled to another terminal of the second resistor Q2, and an emitter of the third transistor Q3 is coupled to a ground voltage GND. A base of the fourth transistor Q4 is coupled to another terminal of the third resistor R3 so as to receive the bias current IB, a collector of the fourth transistor Q4 is coupled to a second system voltage VCC, and an emitter of the fourth transistor Q4 is coupled to the ground voltage GND. Further, in particular embodiments, the first transistor Q1 is a pseudo high electron mobility transistor (p-HEMT) with depletion-type, and the transistor Q2, Q3 and Q4 are heterojunction bipolar transistor (HBT).

In the present embodiment, the RF power amplifier 200 comprises an active element to amplify signal and a simple amplifier that comprises an input match circuit 140 and an output match circuit 150. The RF power amplifier 200 is mainly to rise the transmitted modulated signals to the appropriate high voltage level, so that the strength of signal is sufficient to provide the receiving end to restore the signal when the signal sent out via radio wave media reach the receiving end. For example, the third-generation (3G)/fourth generation (4G) mobile phone system for accuracy of the RF output power has extremely strict requirements. Because voltage value of the phone battery will change significantly, from 3.2 volts to 4.2 volts, therefore the accuracy of the output power for the RF power amplifier will be affected.

Figure 3:
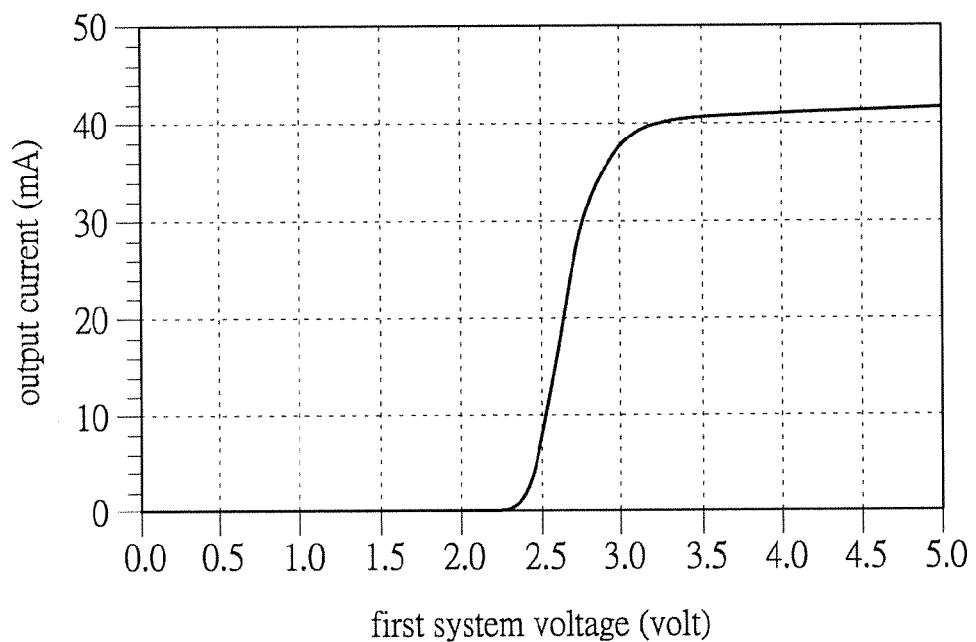
FIG. 3 shows a curve view of an output current compared to a first system voltage corresponding to FIG. 2.

Referring to FIGS. 2 and 3, FIG. 3 shows a curve view of an output current compared to a first system voltage corresponding to FIG. 2. FIG. 3 shows that, when the first system voltage VDD increases to about 3.2 volts, the output current IC will begin to show phenomena of steady current, therefore it meets the requirements of the phone system. Furthermore, the second current I2 will flow through the first resistor R1, the second output terminal T2 outputs the second current I2 to the third transistor Q3, and meanwhile, the second transistor Q2 receives the first current I1. Through characteristics of the three-terminal current source circuit 110, the first resistor R1 is used to set the value of the bias current IB so as to trigger the second transistor Q2 with the first current I1, and outputs the bias current IB to the fourth transistor Q4 (i.e., the output transistor) of the output-stage circuit 130 via the operation of second transistor Q2, the second resistor R2, the third resistor R3 and the third transistor Q3 so that the fourth transistor Q4 works at an operation point. In AC mode, the fourth transistor Q4 is used for receiving an RF input signal RFIN and enlarge it so as to output the RF output signal RFOUT. It is to be noted that, when area of the fourth transistor Q4 is N times area of the third transistor Q3 and resistor value of the second resistor R2 is N times resistor value of the third resistor R3, the output current IC is N times the second current I2, and N is a real number larger than one. Moreover, temperature can be compensated through adjusting the ratio between the resistor R2 and R3. Additionally, because the base of the second transistor Q2 is coupled to a terminal of the first resistor R1, which means the first output terminal T1 in FIG. 2, voltage of the second output terminal T2 of another terminal of the second resistor R2 is only to be able to make the third transistor Q3 operate normally, i.e., the third transistor Q3 enters the active region. When the third transistor Q3 works in the active region, the base voltage of the second transistor Q2 is a sum of the base-emitter voltage of the second transistor Q2, a voltage-drop of the second resistor R2 and a base-emitter voltage of the third transistor Q3, and then voltage of a terminal of the first resistor R1 is locked at a base voltage of the second transistor Q2, and thus this helps to reduce the operating voltage of the RF power amplifier 200. In one embodiment, the collector-emitter voltage of the third transistor Q3 is 2.2 volts or so, and thus voltage of three-terminal current source circuit 110 generating a steady current is about 1 volt or so, in other words, voltage between the second output terminal T2 and the first transistor Q1 is merely 1 volt or so. Accordingly, as long as the first system voltage VDD increases to 3.2 volt, the fourth transistor Q4 generates the output current IC stable.

In one embodiment, the output-stage circuit 130 further comprises an inductor L, capacitors CIN and COUT. A terminal of the capacitor CIN is coupled to a base of the fourth transistor Q4, and another terminal COUT of the capacitor COUT is coupled to the RF input signal. The inductor L is coupled between the second system voltage VCC and a collector of the fourth transistor Q4. A terminal of the capacitor COUT is coupled to the collector of the fourth transistor Q4, and another terminal of the capacitor COUT is coupled to the RF output signal RFOUT.

When the RF power amplifier 200 has not yet start to receive the RF input signal RFIN, the inductance L presents a low impedance state compared to a direct signal, such as short circuit, and the capacitor CIN, COUT presents a high impedance state compared to the DC signal, such as open circuit. When the RF power amplifier 200 starts to receive the RF input signal RFIN, the inductance L presents a high impedance state compared to high-frequency signal, such as the open circuit, and the capacitor CIN, COUT presents a low impedance state compared to high-frequency signal, such as the short circuit. Accordingly, the RF power amplifier 200 may operate smoothly in DC operating mode and AC operating mode.

Figure 4:
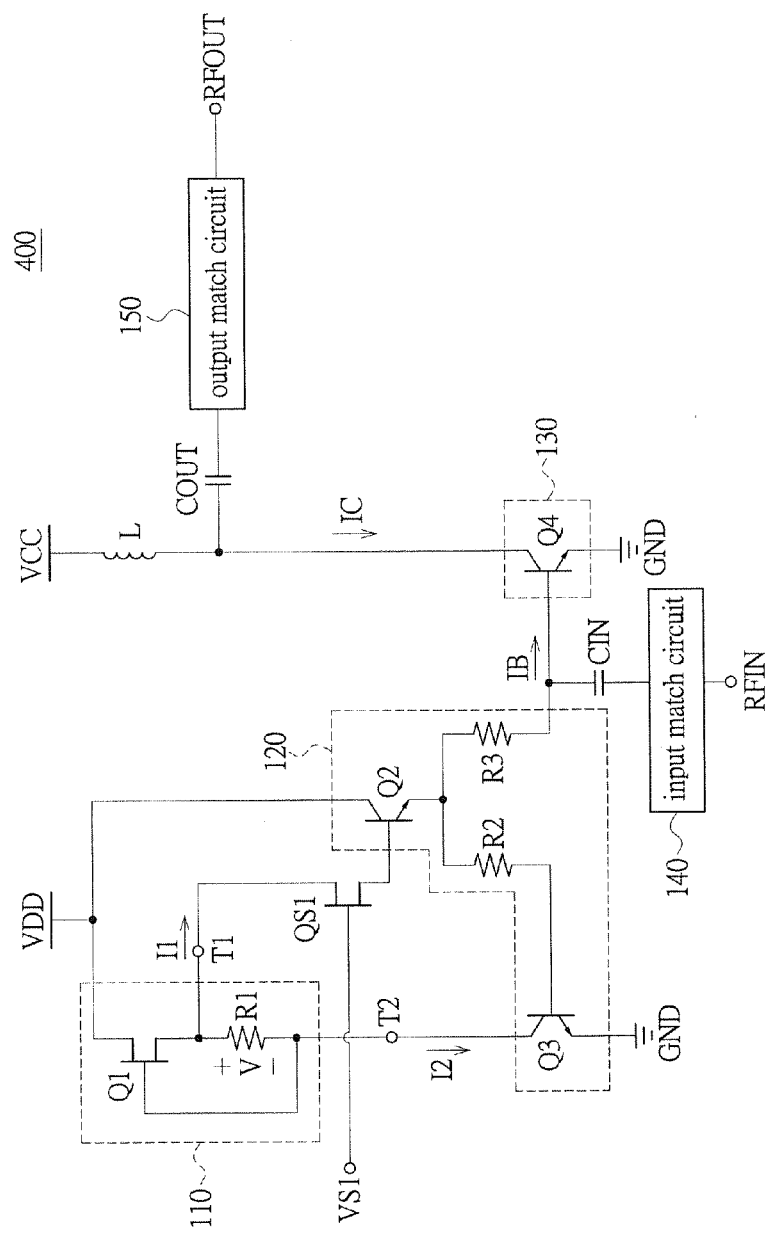
FIG. 4 shows a circuit schematic diagram of a RF power amplifier according to another embodiment of the instant disclosure.
Figure 5A:
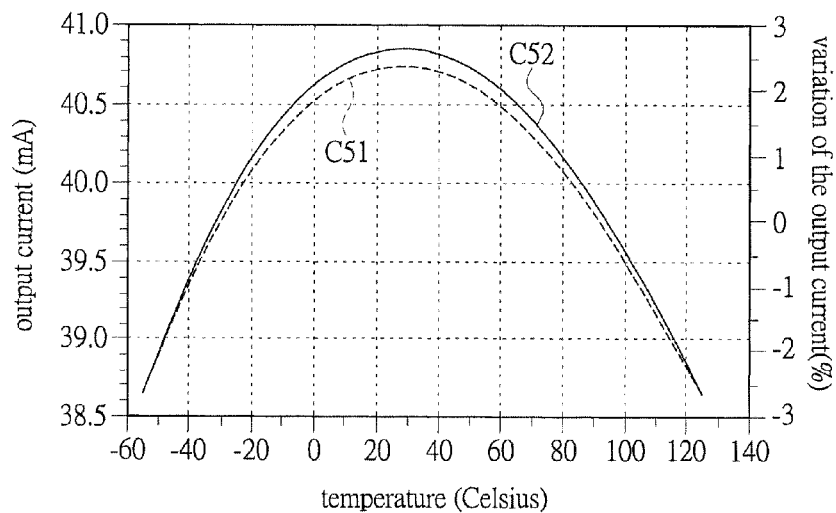
FIGS. 5A~5D shows a simulation curve view corresponding to an embodiment in FIG. 4.
Figure 5B:
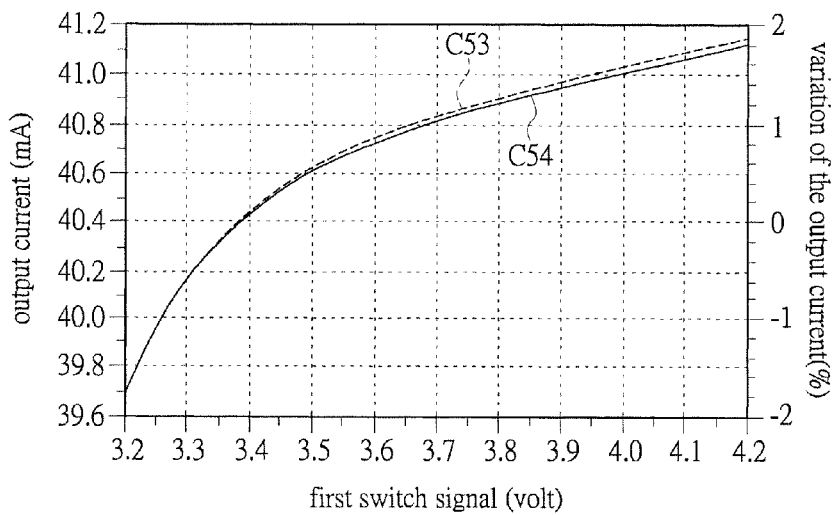
Figure 5C:
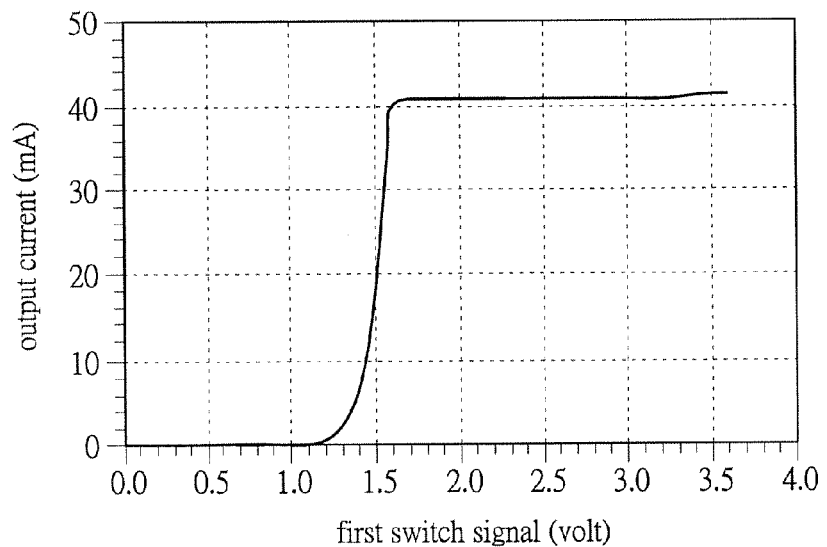
Figure 5D:
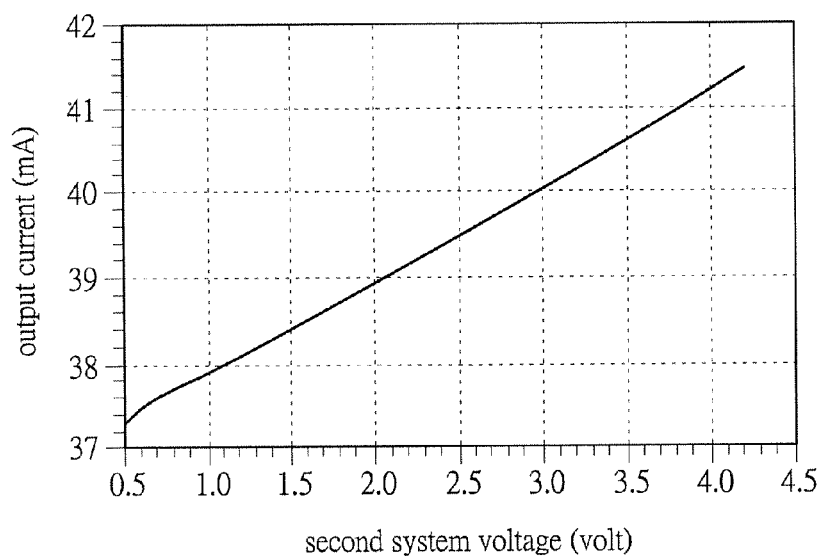

FIG. 4 shows a circuit schematic diagram of a RF power amplifier according to another embodiment of the instant disclosure. Different from the embodiment in the FIG. 2, the RF power amplifier 400 in this embodiment, there is a first switch transistor QS1 located in a current path of the first current I1, wherein the first switch transistor QS1 is a pseudo high electron mobility transistor (p-HEMT) with depletion-type. A drain of the first switch transistor QS1 is coupled to a terminal of the first resistor R1, a gate of the first switch transistor QS1 is coupled to a first switch signal VS1, a source of the first switch transistor QS1 is coupled to the base of the second transistor Q2, wherein the first switch transistor QS1 determines to be switched on or off according to voltage level of the first switch signal VS1. In other words, a state of being switched on or off of the first switch transistor QS1 is able to determine a state of being opened or closed of the RF power amplifier 400. Accordingly, when the first switch transistor QS1 is turned on, an effect of circuit operation of the embodiment in FIG. 4 is equal to an effect of circuit operation of the embodiment in FIG. 2 correspondingly. Referring to FIG. 4, and FIGS. 5A~5D concurrently, FIG. 5A shows a curve diagram of the output current compared to variation of temperature according to one embodiment of the instant disclosure, wherein a curve C51 shows the output current IC, and a curve C52 shows a variation of the output current IC. FIG. 5A shows that the change in temperature, the deviation of the RF power amplifier 400 of the output current IC (deviation) is less than ±3 percent, which has a very good performance. FIG. 5B shows a curve diagram of the output current compared to change of the first system voltage according to one embodiment of the instant disclosure, wherein a curve C53 shows the output current IC, and a curve C52 shows a variation of the output current IC. FIG. 5B shows that variation of output current IC compared to the first system voltage VDD is less than +2%. FIG. 5C shows a curve diagram of the output current compared to change of the first switch signal according to one embodiment of the instant disclosure. FIG. 5C shows that designers may make the first switch transistor QS1 being coupled to a base of a second transistor Q2 and an emitter of the first transistor Q1, so that a switching logic level of the first switching transistor QS1 is in the 1.8 volt level. In one embodiment, when voltage of the first switch signal VS1 is between 0 volt and 1 volt, it means the first switch signal VS1 is in low voltage level; when voltage of the first switch signal VS1 is between 3.3 volt and 1.7 volt, it means the first switch signal VS1 is in high voltage level. FIG. 5D shows a curve diagram of the output current compared to change of the second switch signal according to one embodiment of the instant disclosure. The designer may dynamically adjust the second system voltage VCC through a way of DC-to-DC to achieve dynamically adjust current value of the output current IC, so that the RF power amplifier 400 meets the need of different high-linearity corresponding to different output power.

Figure 6:
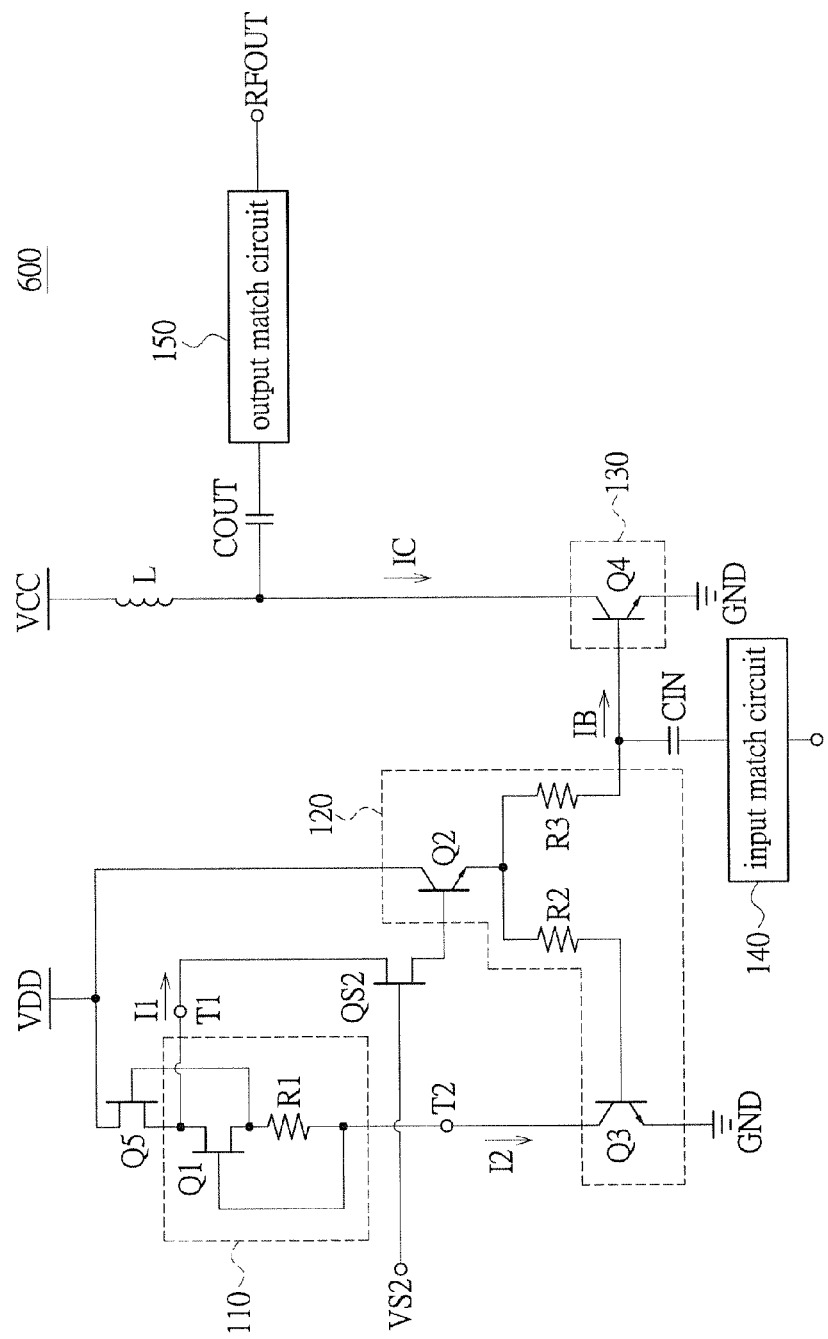
FIG. 6 shows a circuit schematic diagram of the RF power amplifier according to another embodiment of the instant disclosure.
Figure 7A:
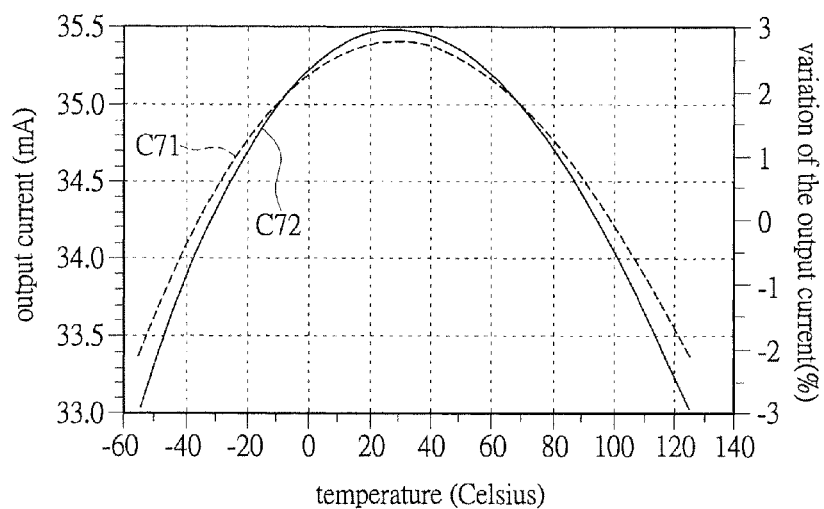
FIGS. 7A~7D shows a simulation curve view corresponding to an embodiment in FIG. 6.
Figure 7B:
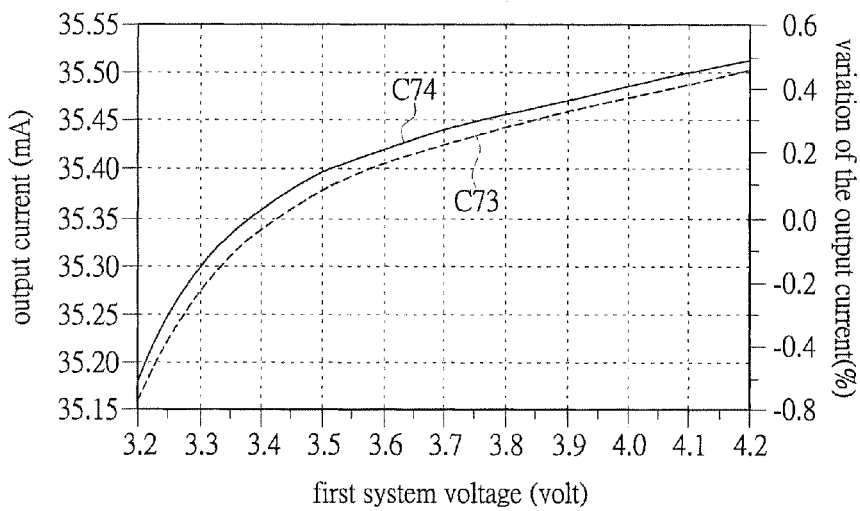
Figure 7C:
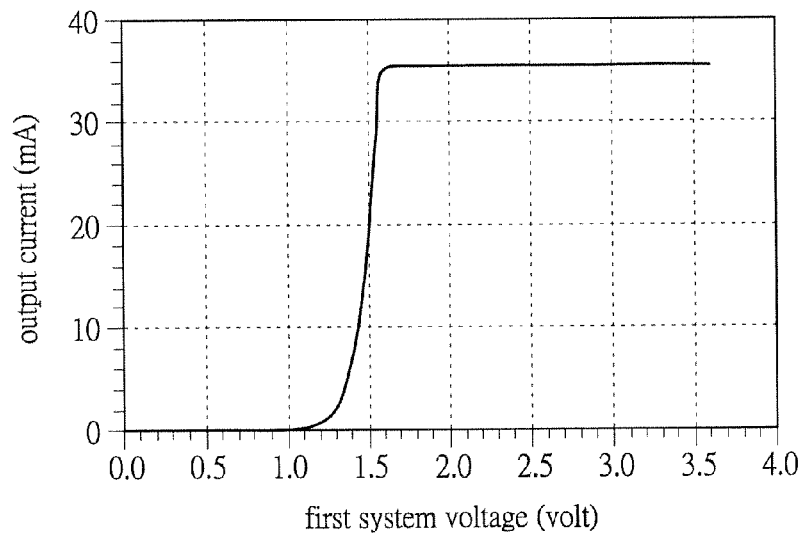
Figure 7D:
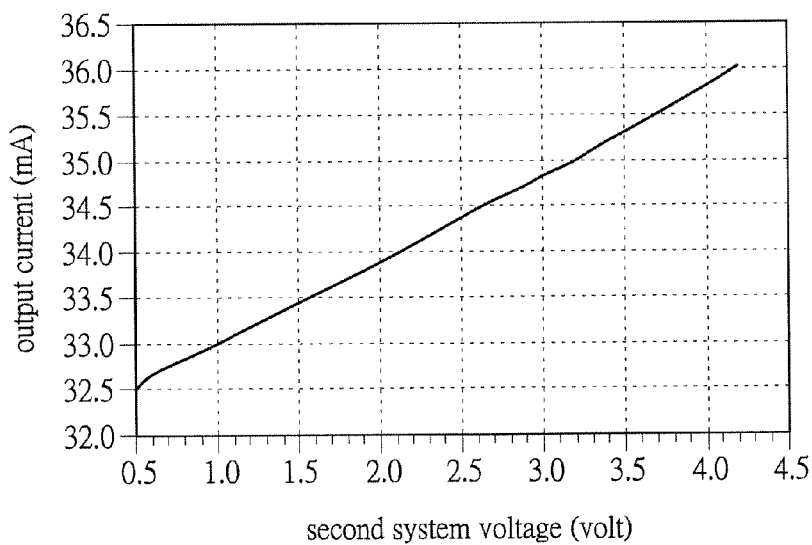

FIG. 6 shows a circuit schematic diagram of the RF power amplifier 600 according to another embodiment of the instant disclosure. Comparing FIG. 6 with FIG. 4, the difference is that there is a fifth transistor Q5 exists between the first system voltage VDD and the first transistor Q wherein the fifth transistor Q5 is a pseudo high electron mobility transistor (p-HEMT) with depletion-type. A gate of the transistor Q5 is coupled to a terminal of the first resistor R1, a drain of the fifth transistor Q5 is coupled to the first system voltage VDD, and a source of the fifth transistor Q5 is coupled to the drain of the first transistor Q1. The fifth transistor Q5 is used for stabilizing the first system voltage VDD compared to a variation of the output current IC. Moreover, the RF power amplifier 600 further comprises a second switch transistor QS2, wherein the second switch transistor QS2 is a pseudo high electron mobility transistor (p-HEMT) with depletion-type. A drain of the second switch transistor QS2 is coupled to the drain of the first transistor Q1, a gate of the second switch transistor QS2 receives a second switch signal VS2, and a source of the second switch transistor QS2 is coupled to the base of the second transistor Q2. The second switch transistor QS2 determines to be switched on or off according to voltage level of the second switch signal VS2. An operation of the second switching transistor QS2 in RF power amplifier 600 is the same as that of the first switching transistor QS1 in the above-mentioned embodiment of FIG. 4. Referring to FIG. 6 and FIGS. 7A~7D, wherein FIGS. 7C and 7D are the same as above-mentioned FIGS. 5C and 5D. Compared to FIGS. 5C and 5D, the RF power amplifier 700 has better performance for the output current IC compared to change of temperature or change of the first system voltage VDD in FIGS. 7A and 7D. Furthermore, compared to FIG. 5B, the output current IC compared to the change of the first system voltage VDD is less than ±2%. However, the output current IC compared to the change of the first system voltage VDD is less than ±0.5% in FIG. 7B, wherein a curve C73 shows the output current and the curve C74 shows a variation of the output current. Accordingly, when the first system voltage VDD changes from 3.2 volts to 4.2 volts, the RF power amplifier 700 is able to further stabilize the output current IC in present embodiment.

In the following embodiments, there are only parts different from embodiments in FIG. 6 described, and the omitted parts are indicated to be identical to the embodiments in FIG. 6.

Figure 8:
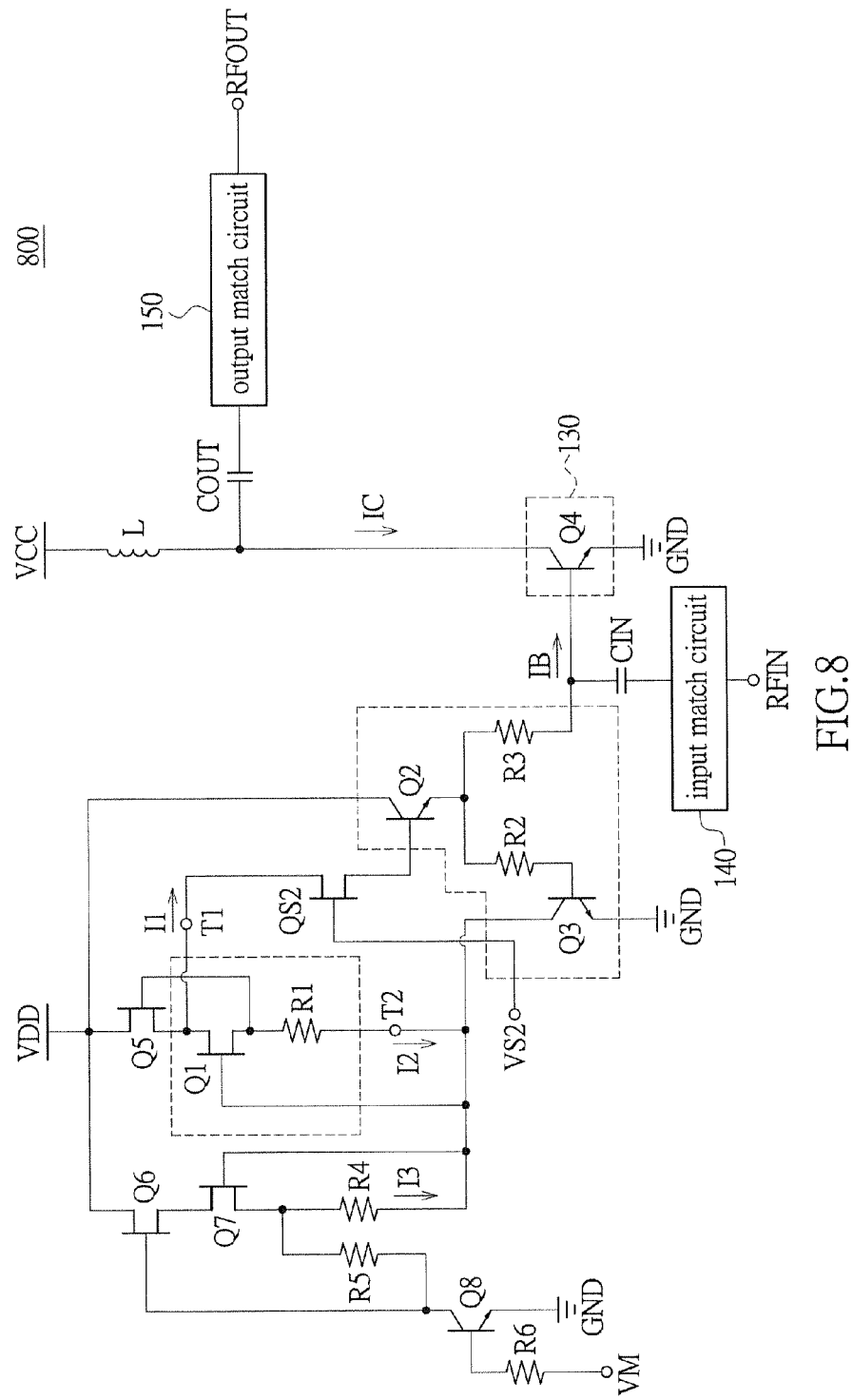
FIG. 8 shows a circuit schematic diagram of a RF power amplifier according to another embodiment of the instant disclosure.

FIG. 8 shows a circuit schematic diagram of a RF power amplifier according to another embodiment of the instant disclosure. The difference from above-mentioned embodiment in FIG. 6 is that, the RF power amplifier 800 further comprises a sixth transistor Q6, a seventh transistor Q7, a fourth resistor R4, a fifth resistor R5 and the eighth transistor Q8, wherein the transistor Q6 and Q7 are pseudo high electron mobility transistor (p-HEMT) with depletion-type and the transistor Q8 is hetero junction bipolar transistor (HBT). A drain of the sixth transistor Q6 is coupled to the first system voltage VDD. A drain of the seventh transistor Q7 is coupled to a source of the sixth transistor Q6, and a gate of the seventh transistor Q7 is coupled to another terminal of the first resistor R1. A terminal of the fourth resistor R4 is coupled to a source of the seventh transistor Q7, and another terminal of the fourth resistor R4 is coupled to a gate of the seventh transistor Q7. A terminal of the fifth resistor R5 is coupled to a terminal of the fourth resistor R4. A collector of the eighth transistor Q8 is coupled to another terminal of the fifth resistor R5, a base of the eighth transistor Q8 is coupled to a mode-switch signal VM via the sixth resistor R6, and an emitter of the eighth transistor Q8 is coupled to a ground voltage GND.

In the present embodiment, the eighth transistor Q8 is served as a switch. The RF power amplifier 800 cut off the eighth transistor Q8, through low voltage level of the mode-switch signal VM, so as to activate another set of the current source circuit which is configures by the sixth transistor Q6, the seventh transistor Q7 and the fourth resistor R4, so that the RF power amplifier 800 may significantly increase the output current IC to increase output power of the RF power amplifier 800 for meeting the need of communication corresponding to different RF output power. In other words, When the mode switching signal VM is low voltage level (i.e., the eighth transistor Q8 is switched off), the transistor Q6, Q7 and the fourth resistor R4 may generate a third current I3, and the third current I3 flows into the third transistor Q3 together with the second current, so that the output current IC of the RF power amplifier 800 may increase significantly to form a big current. Afterwards, the RF power amplifier 800 enters into a high output power mode, so as to meet the need of communication for high output power. When the mode switching signal VM is high voltage level (i.e., the eighth transistor Q8 is switched on so as to make a gate of the sixth transistor Q6 be coupled to the ground voltage GND), only the second current I2 will flow into the third transistor Q3 and then the output current I3 of the RF power amplifier 800 may decrease to a small current. Afterwards, the RF power amplifier 800 enters into a low output power mode, so as to meet the need of communication for low output power.

Figure 9A:
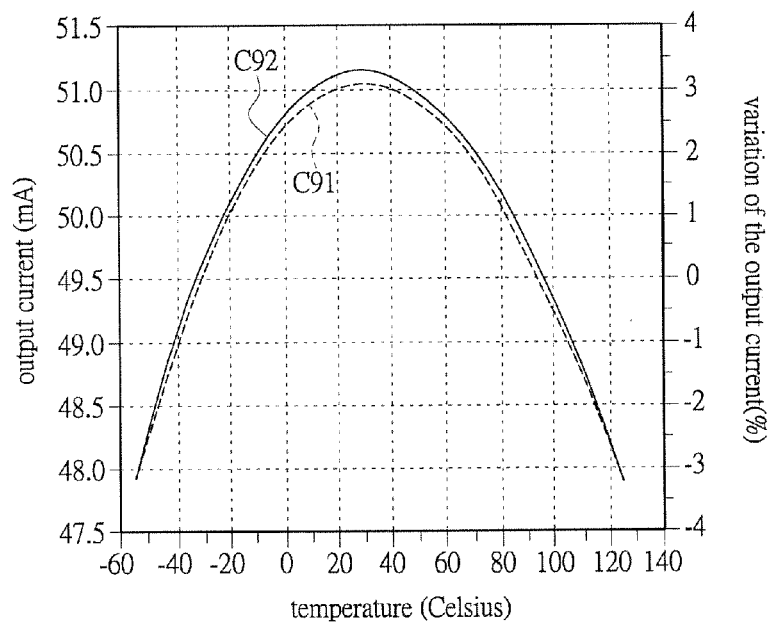
FIGS. 9A~9E shows a simulation curve view corresponding to an embodiment in FIG. 8.
Figure 9B:
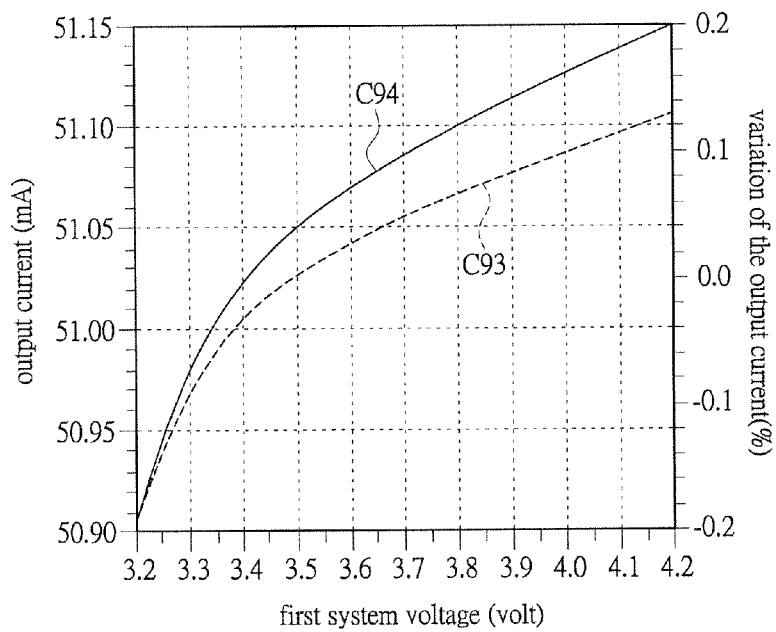
Figure 9C:
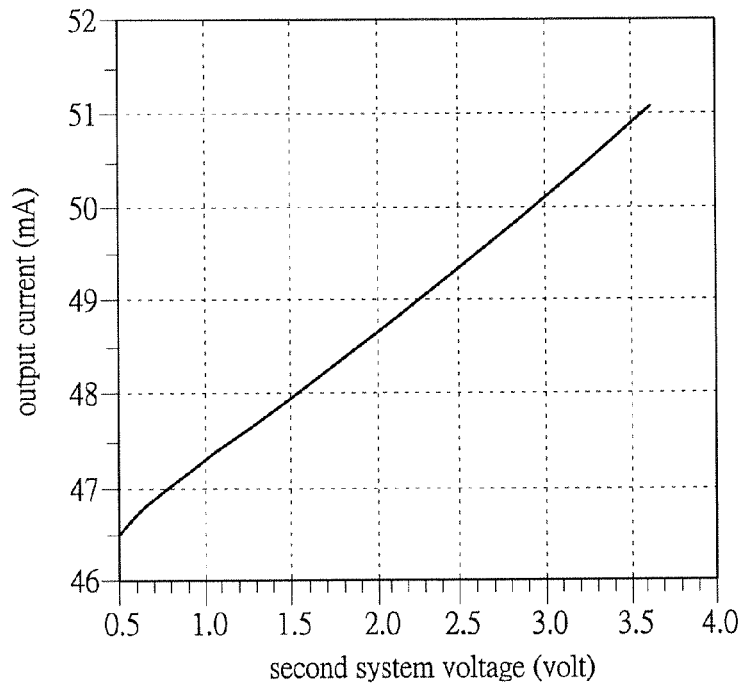
Figure 9D:
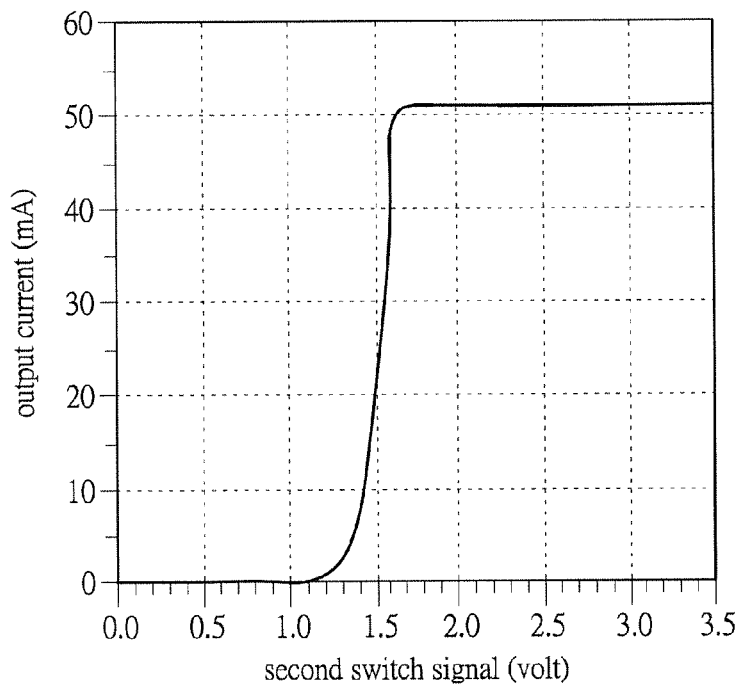
Figure 9E:
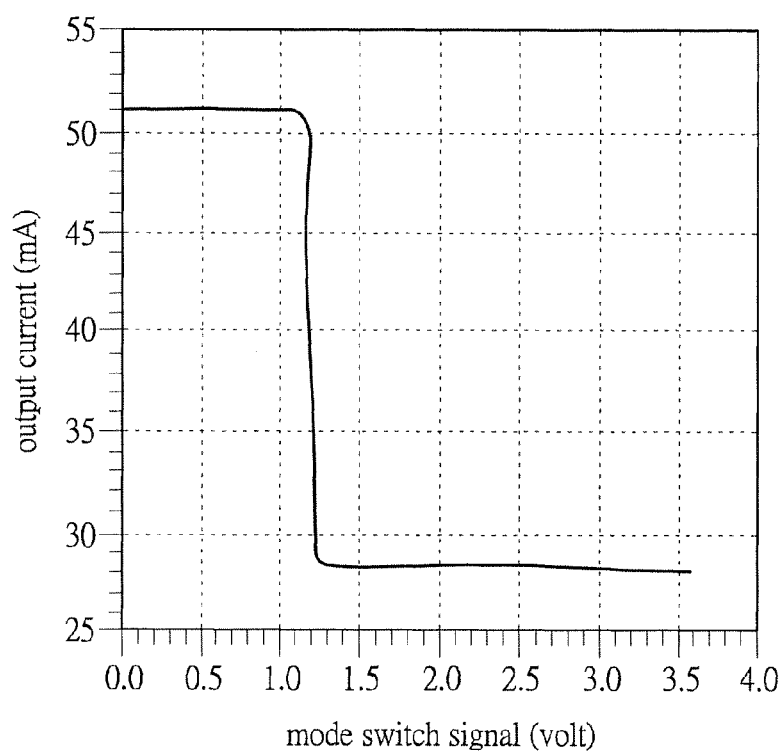

Referring to FIG. 8 and FIGS. 9A~9E concurrently, the curve C91 shows the output current and the curve C92 shows a variation of the output current in FIG. 9A, and the curve C93 shows the output current and the curve C97 shows a variation of the output current in FIG. 9B. FIG. 9C show a curve view of the output current compared to the second system voltage. FIG. 9D show a curve view of the output current compared to the second switch signal. FIG. 9E show a curve view of the output current compared to the mode-switch signal. In FIG. 9E, the following description assume that the second switching transistor QS2 is turned on, when the mode switching signal VM is larger than 1.2 volt, the output current IC of the RF power amplifier 800 is approximately 28.5 milliamperes (mA), and when the mode switching signal VM is smaller than 1.2 volt, the output current IC of the RF power amplifier 800 is approximately 51 mA, so that the output current IC can be increased to 1.78 times, in order to further enhance the output power of the RF power amplifier 800.

Figure 10:
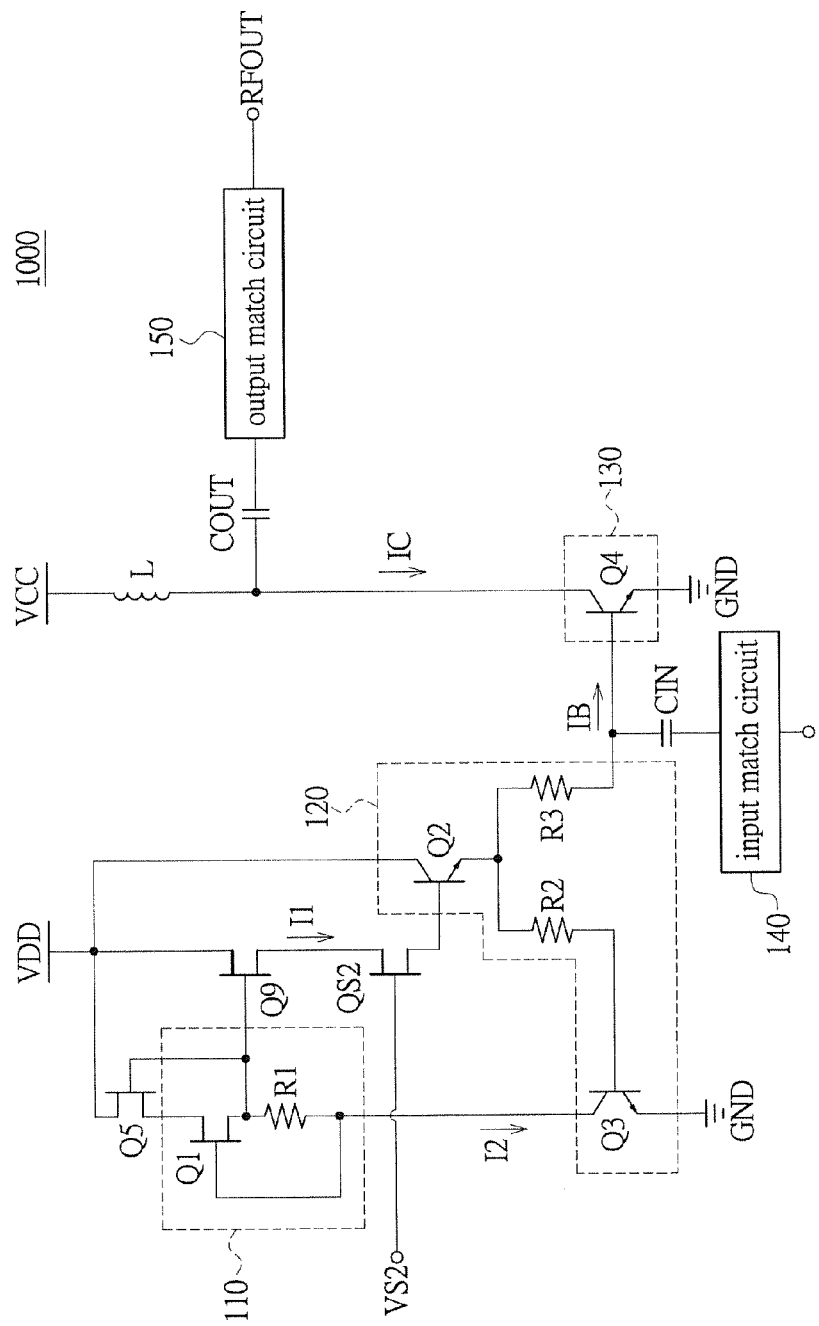
FIG. 10 shows a circuit schematic diagram of a RF power amplifier according to another embodiment of the instant disclosure.

In the above embodiment, when the first system voltage of the RF power amplifier 200,400,600 and 800 is between at 3.2 volt and 4.2 volt, the RF power amplifier 200,400,600 and 800 are able to generate a stable output current of IC. However, in one embodiment of the instant disclosure is able to pull down the operation voltage from 3.2 volt to 2.8 volt. Referring to FIG. 10, the difference from above-mentioned embodiment in FIG. 6, the RF power amplifier 1000 in this embodiment further comprises a ninth transistor Q9, which is pseudo high electron mobility transistor (p-HEMT) with depletion-type. A drain of the ninth transistor Q9 is coupled to the first system voltage VDD, a gate of the ninth transistor Q9 is coupled to a terminal of the first resistor R1, and a source of the ninth transistor Q9 is coupled to a drain of the second switch transistor QS2 and outputs the first current I1. Because the gate of ninth transistor Q9 does not have any current passed, in the present embodiment, the first current I1 is generated by the first system voltage VDD and the ninth transistor Q9, however, the first current I1 will flow to the drain of the second switching transistor QS2, which is the same phenomenon. Moreover, a gate voltage of the ninth transistor Q9 is lower than a source voltage of the ninth transistor Q9, so the ninth transistor Q9 which is pseudo high electron mobility transistor (p-HEMT) is used for decreasing a voltage of a terminal of the first resistor R1. In one embodiment, a source voltage of the ninth transistor Q9 is 2.6 volt and a gate voltage of the ninth transistor Q9 is 1.6 volt, so a voltage of a terminal of the first resistor R1 may be locked at 1.6 volt. Afterwards, because a voltage-drop of the second current I2 flowing through the first resistor R1, a voltage of another terminal of the first resistor R1 is 1.2 volt or so, and then voltage with 1.2 volt is enough to make the third transistor Q3 enters into normal operation or active region. Accordingly, the first system voltage VDD may be pull down from 3.2 volt to 2.8 volt so as to the RF power amplifier 1000 outputs stable output current IC; which means, the output current IC is stable when the first system voltage VDD changes between 2.8 volt and 4.2 volt.

Figure 11:
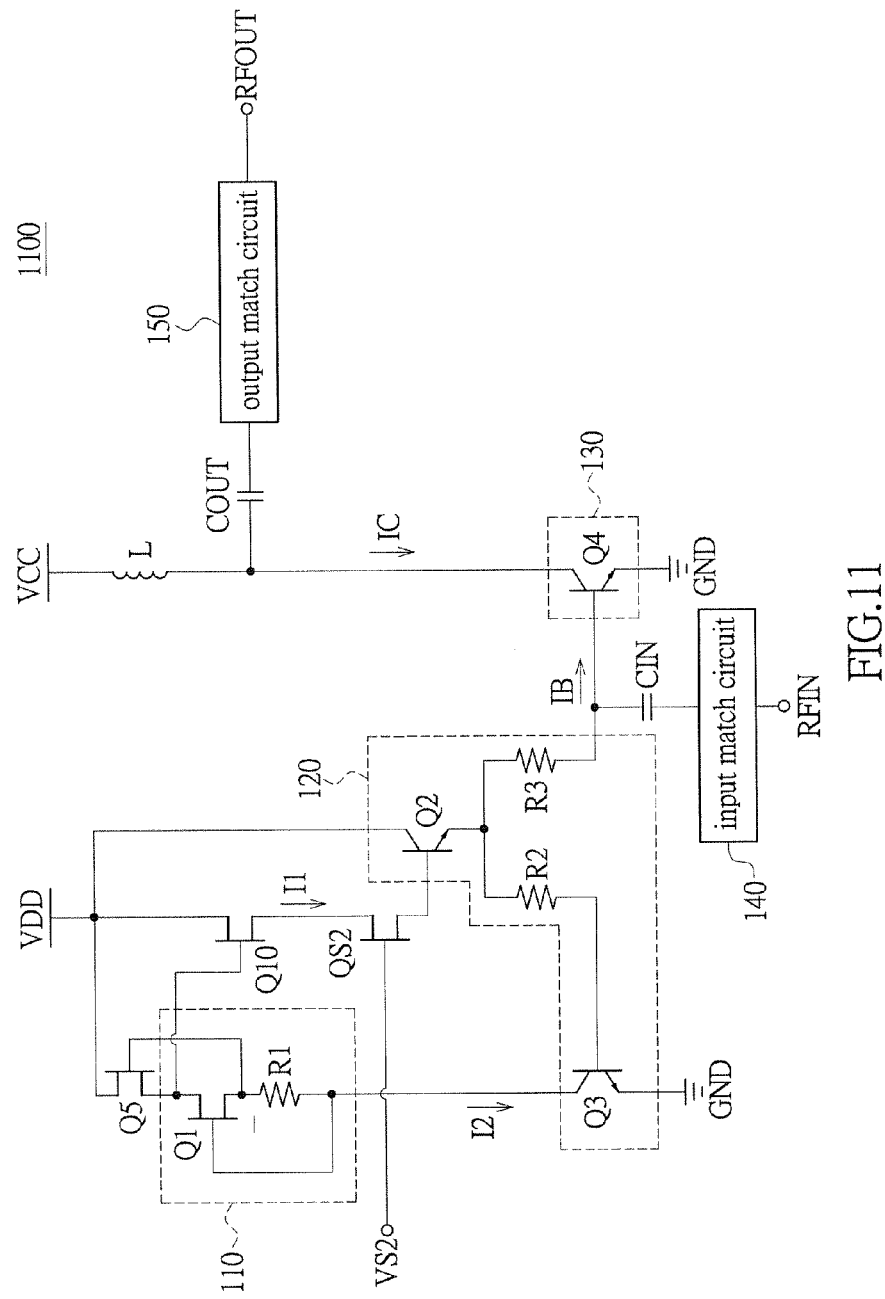
FIG. 11 shows a circuit schematic diagram of the RF power amplifier according to change connection relation of FIG. 10.

FIG. 11 shows a circuit schematic diagram of the RF power amplifier according to the changed connection relation of FIG. 10. Comparing FIG. 11 with FIG. 10, the difference shown in the RF power amplifier 1100 is as follows: a drain of the tenth transistor Q10 is coupled to the first system voltage VDD, a gate of the tenth transistor Q10 is coupled to a drain of the first transistor Q1, and a source of the tenth transistor Q10 is coupled to a drain of the second switch transistor QS2 and outputs the first current I1, wherein the tenth transistor Q10 is pseudo high electron mobility transistor (p-HEMT) with depletion-type and used for decrease drain voltage of the first transistor Q1. Accordingly, it makes the source voltage of the fifth transistor Q5 be locked at the gate voltage of the tenth transistor Q10, and then voltage of a terminal of the first resistor R1 (i.e., source of the first transistor Q1) may be lower to pull down a drain-emitter voltage of the third transistor Q3, however, the third transistor Q3 is still in normal operation. Therefore, the output current IC is able to be stabled when the first system voltage VDD changes between 2.6 volt and 4.2 volt.

Figure 12:
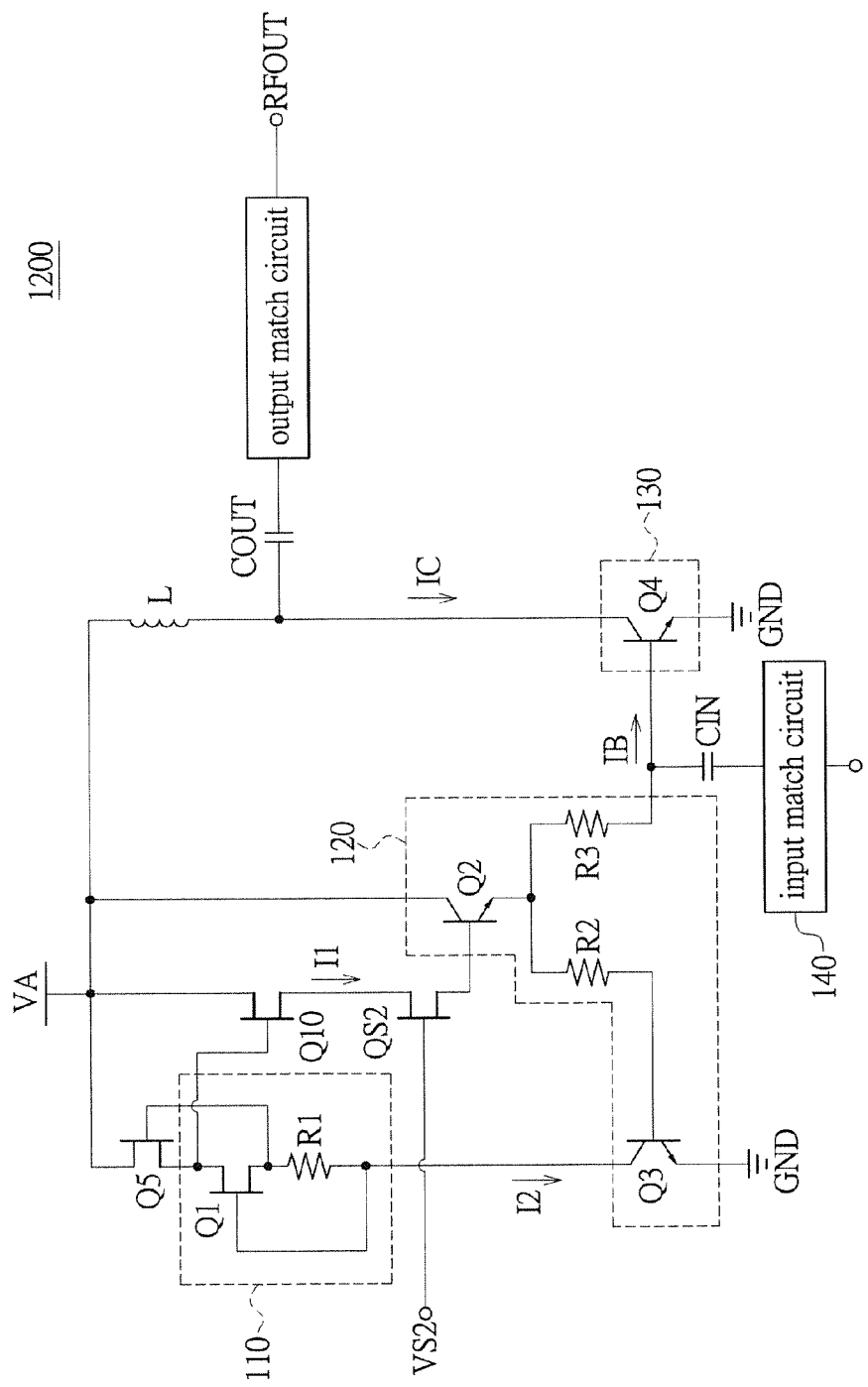
FIG. 12 shows a circuit schematic diagram of the RF power amplifier with one set of supply voltage according to one embodiment of the instant disclosure.

FIG. 12 shows a circuit schematic diagram of the RF power amplifier with one set of supply voltage according to one embodiment of the instant disclosure. In this embodiment, the first system voltage VDD and the second system voltage VCC are merged to share a set of supply voltage VA so as to operate the RF power amplifier 1200. The way of sharing a set of supply voltage VA is also applicable to the RF power amplifier 1100 200,400,600,800, 1000 and 1100 above-mentioned.

Figure 13:
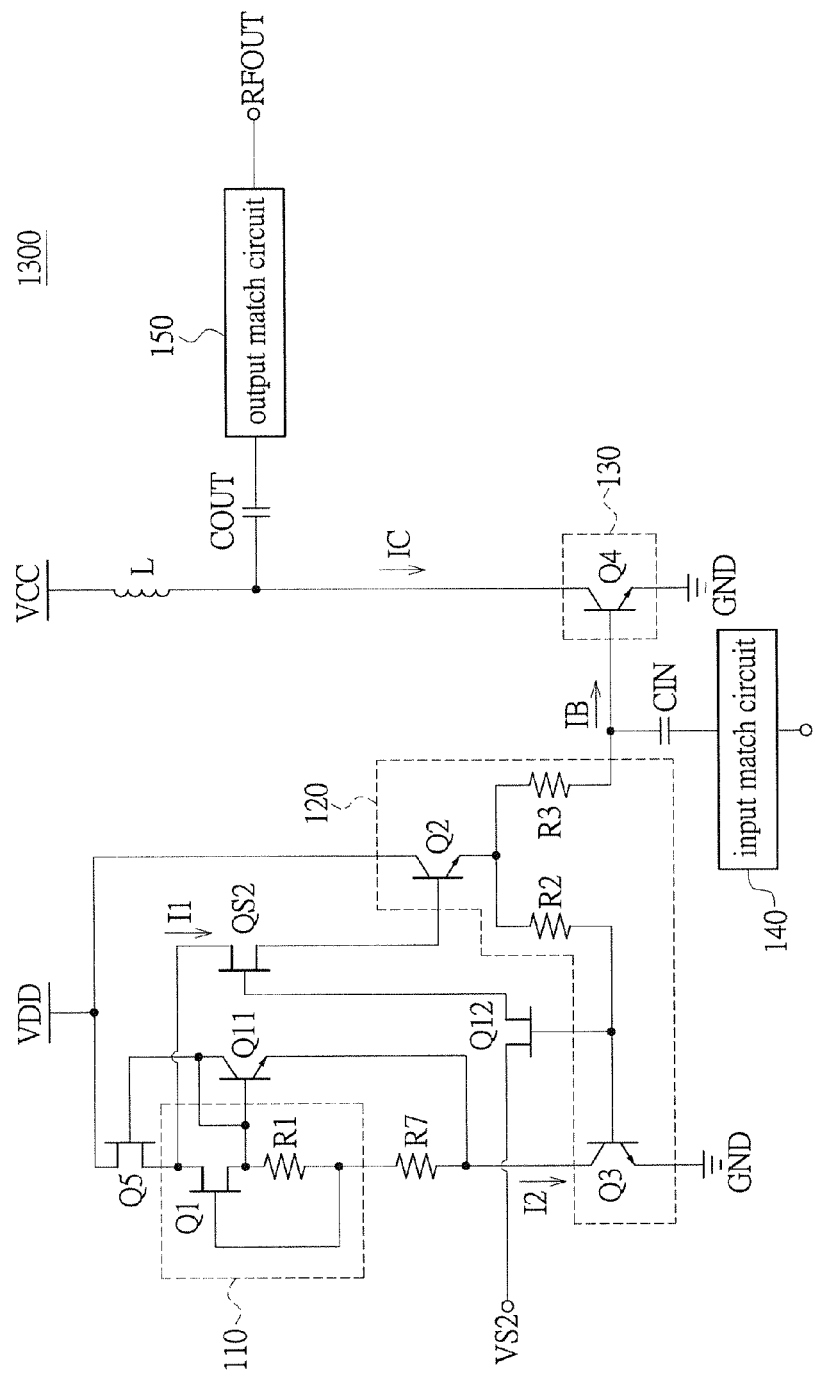
FIG. 13 shows a circuit schematic diagram of the RF power amplifier with better temperature compensation effect according to another embodiment of the instant disclosure.

FIG. 13 shows a circuit schematic diagram of the RF power amplifier with better temperature compensation effect according to another embodiment of the instant disclosure. The difference from the embodiment in FIG. 6, the RF power amplifier 1300 further comprises an eleventh transistor, a twelfth transistor and a seventh resistor, wherein the transistor Q11 is hetero junction bipolar transistor (HBT) and the transistor Q12 is pseudo high electron mobility transistor (p-HEMT) with depletion-type. A collector of the eleventh transistor Q11 is coupled to a gate of the fifth transistor Q5, a base of the eleventh transistor Q11 is coupled to a source of the first transistor Q1, and a base and a collector of the eleventh transistor Q11 are coupled to each other. A terminal of the seventh resistor R7 is coupled to another terminal of the first resistor RE another terminal of the seventh resistor R7 is coupled to an emitter of the eleventh transistor Q11 and a collector of the third transistor Q3. A gate of the twelfth transistor Q12 is coupled to a base of the third transistor Q3, a source of the twelfth transistor Q12 is coupled to a gate of the second switch transistor QS2, and a drain of the twelfth transistor Q12 is coupled to the second switch signal VS2. Because the third transistor Q3 is hetero junction bipolar transistor (HBT), a gate voltage of the twelfth transistor Q12 is locked at a base-emitter voltage of the third transistor Q3 as the third transistor Q3 works at the active region. In one embodiment, a gate voltage of the twelfth transistor is locked at 1.3 volt and a base-emitter voltage of the second transistor Q2 is also 1.3 volt, so a base voltage of the second transistor Q2 and a source voltage of the second switch transistor QS2 is 2.6 volt. Accordingly, the second switch transistor QS2 may be switched on when a gate of the second switch transistor QS2 receives a voltage larger than 1.6 volt, because the second switch transistor QS2 is pseudo high electron mobility transistor (p-HEMT) with depletion-type. When an input voltage of the second switch signal VS2 is larger than 2.3 volt or so, a gate voltage of the second switch transistor QS2 may be locked at 2.3 volt, so that the output current IV does not be affected when the input voltage of the second switch signal VS2 changes between 1.8 volt and 4.2 volt.

Figure 14:
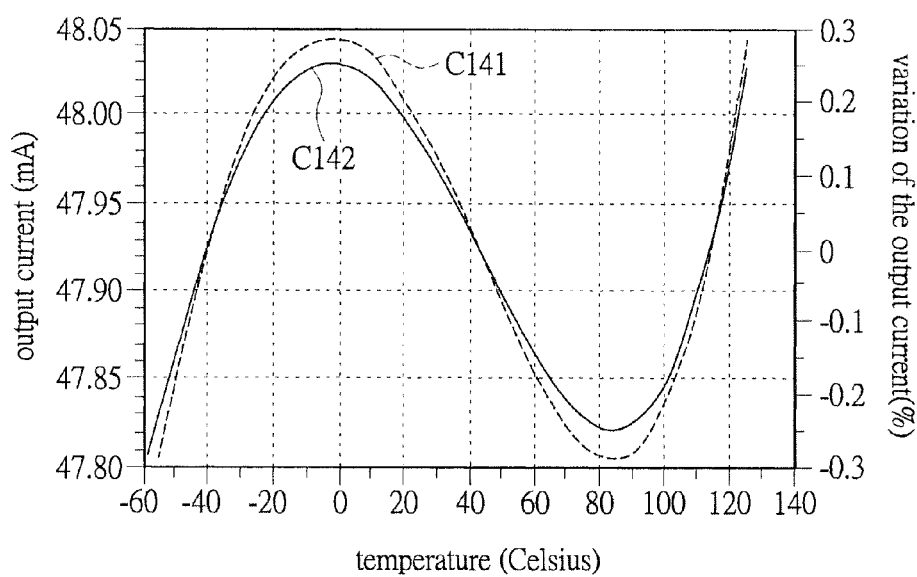
FIG. 14 shows a simulation curve view corresponding to an embodiment in FIG. 13.

Additionally, for the effect of temperature compensation, a base-emitter voltage of the eleventh transistor Q11 is a voltage with negative temperature and a voltage between the first resistor R1 and the seventh resistor R7 is the base-emitter voltage of the eleventh transistor Q11. Therefore, a voltage between gate and source of the first transistor Q1 is equal to the base-emitter voltage of the eleventh transistor Q11 multiplied by a first voltage-dividing resistor ratio, wherein the first voltage-dividing resistor ratio is the first resistor R1 divided by a sum of the first resistor R1 and the seventh resistor R7. Moreover, a gate voltage of the first transistor Q1 has a characteristic of negative temperature, in other words, it may make a base-emitter voltage of the eleventh transistor Q11 be a voltage with characteristic of negative temperature through adjusting ratio between the first resistor R1 and the seventh resistor R7, so that the second current I2 and the bias current IB is a current closed to zero temperature coefficient. Accordingly, the output current IC is close to or equal to the current with zero temperature coefficient through these mechanisms to compensate for temperature effects. Referring to FIGS. 13 and 14, a curve C141 shows an output current and a curve C142 shows a variation of the output current in FIG. 14. FIG. 14 shows that a temperature curve is three-order curve view, and when the temperature changes between minus 55 degrees Celsius to 125 degrees Celsius, the variation of the output current IC is less than ±0.25%. Therefore, the RF power amplifier 1300 of the present embodiment in the face of changes in the environmental temperature, the output current IC is vary stable.

Figure 15:
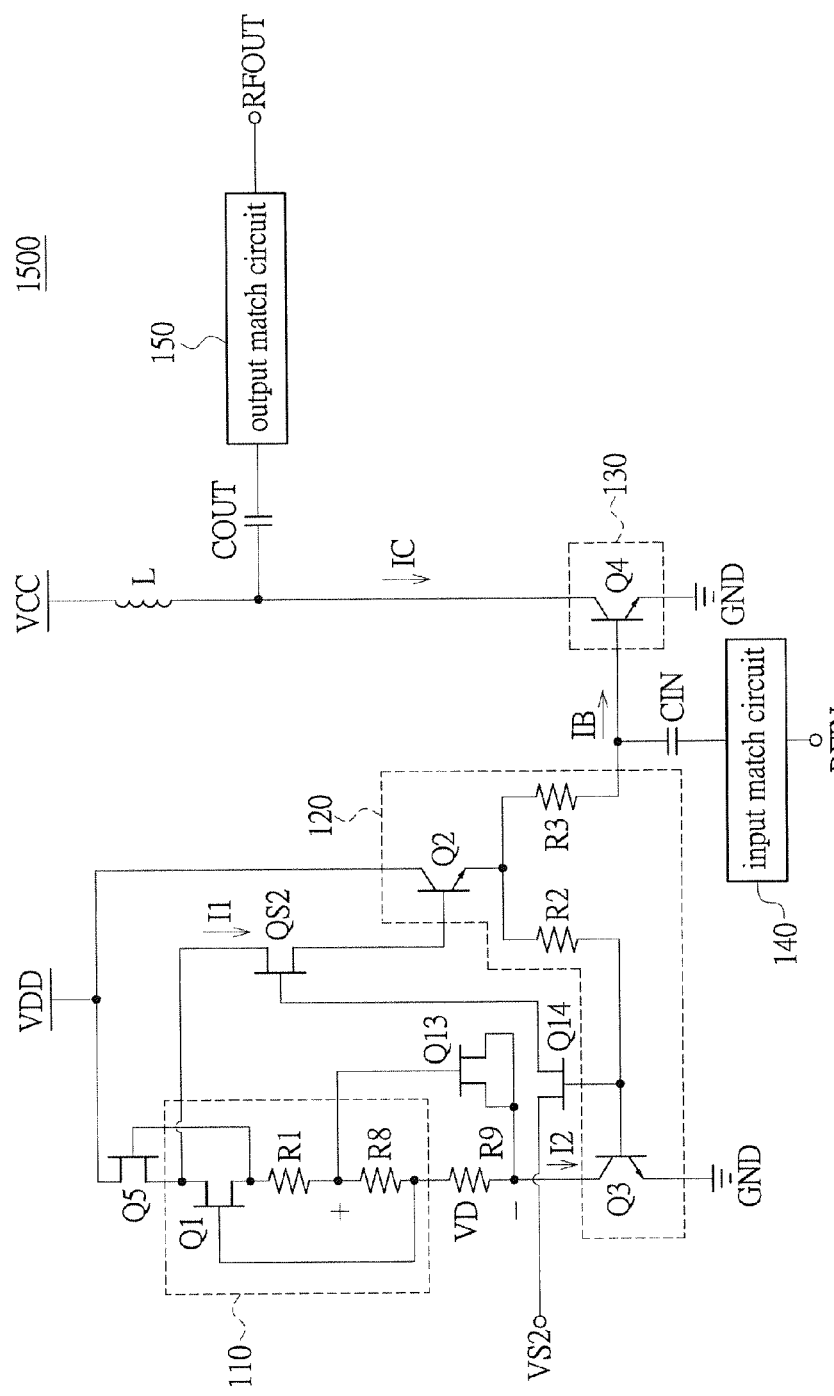
FIG. 15 shows a circuit schematic diagram of the RF power amplifier according to another one embodiment of the instant disclosure.

FIG. 15 shows a circuit schematic diagram of the RF power amplifier according to another one embodiment of the instant disclosure. The difference from above-mentioned embodiment in FIG. 6 is that the RF power amplifier 1500 of the present embodiment further comprises an eighth resistor R8, a ninth resistor R9, a thirteen transistor Q13 and a fourteen transistor Q14, wherein the transistor Q13 and Q14 are pseudo high electron mobility transistor (p-HEMT) with depletion-type. A terminal of the eighth resistor R8 is coupled to another terminal of the first resistor R1, and another terminal of the eighth resistor R8 is coupled to a gate of the first transistor Q1. A terminal of the ninth resistor R9 is coupled to another terminal of the eighth resistor R8. A gate of the thirteen transistor Q13 is coupled to a terminal of the eighth resistor R8, and a drain and source of the thirteen transistor Q13 is coupled to another terminal of the ninth resistor R9. An operation of the fourteen transistor Q14 in RF power amplifier 1500 are the same as that of the twelfth transistor Q12 in the above-mentioned embodiment of FIG. 13, there's no need to go into details.

Figure 16:
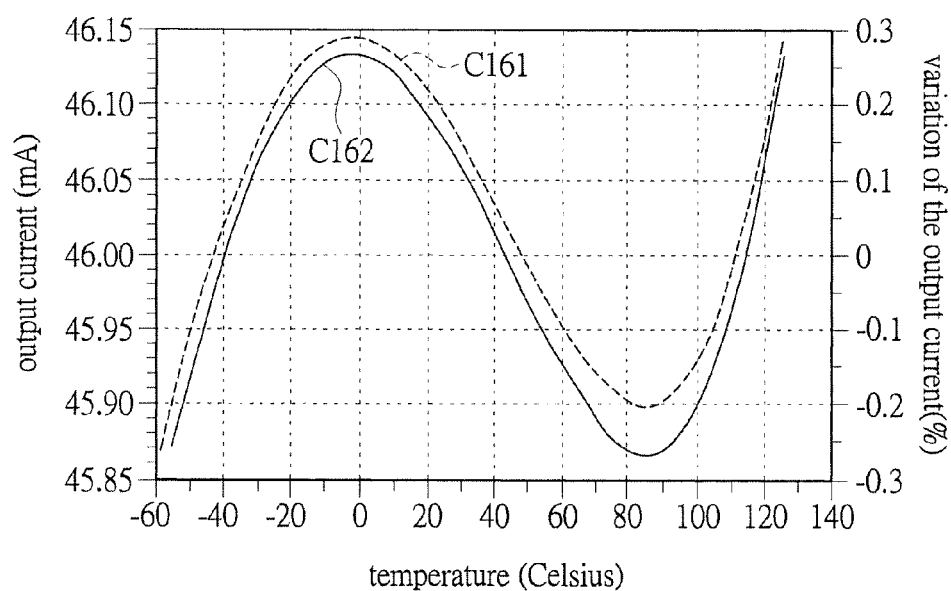
FIG. 16 shows a simulation curve view corresponding to an embodiment in FIG. 15.

Because a source and a drain of the thirteen transistor Q13 is coupled to each other (i.e., diode configuration) and commonly coupled to another terminal of the ninth resistor R9, a voltage of two terminal between the eighth resistor R8 and the ninth resistor R9 is a diode voltage VD with negative coefficient. As shown in FIG. 15, a voltage between gate and source of the first transistor Q1 is the diode voltage VD multiplied by a second voltage-dividing resistor ratio, wherein the second voltage-dividing resistor ratio is the eighth resistor R8 divided by a sum of the eighth resistor R8 and the ninth resistor R9. In other words, it may make the diode voltage VD of the thirteen transistor Q13 is a voltage with negative coefficient through adjusting a ratio of the first resistor R1, the eighth resistor R8 and the ninth resistor R9, so that the second current I2 is a current with zero temperature coefficient. Referring to FIGS. 15 and 16, a temperature curve in FIG. 16 is three-order curve view and when a temperature is between minus 55 degrees Celsius and 125 degrees Celsius, a variation of is less than ±0.265%, wherein a curve C161 shows an output current and a curve C162 shows a variation of the output current. Accordingly, the RF power amplifier 1500 of the present embodiment in the face of changes in the environmental temperature, the output current IC is also vary stable.

Figure 17:
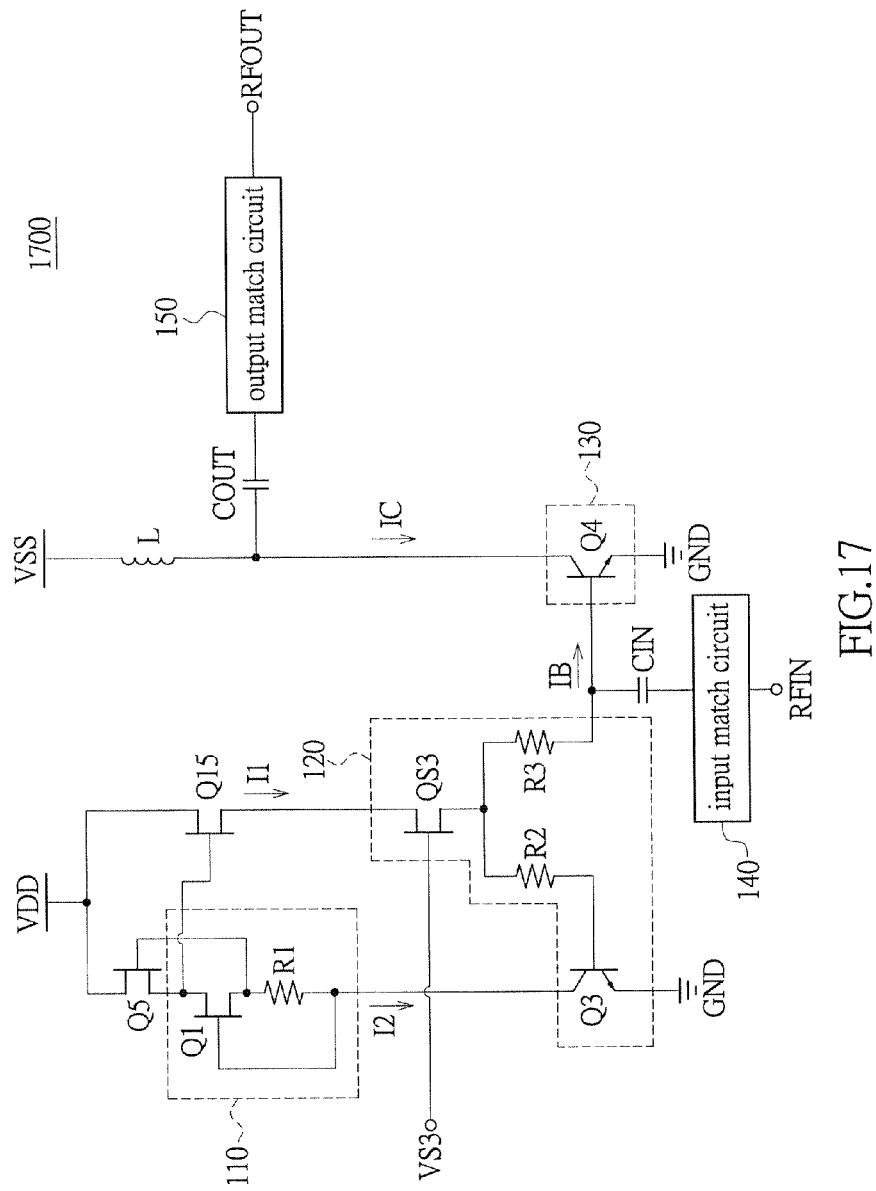
FIG. 17 shows a circuit schematic diagram of the RF power amplifier according to another one embodiment of the instant disclosure.
Figure 18A:
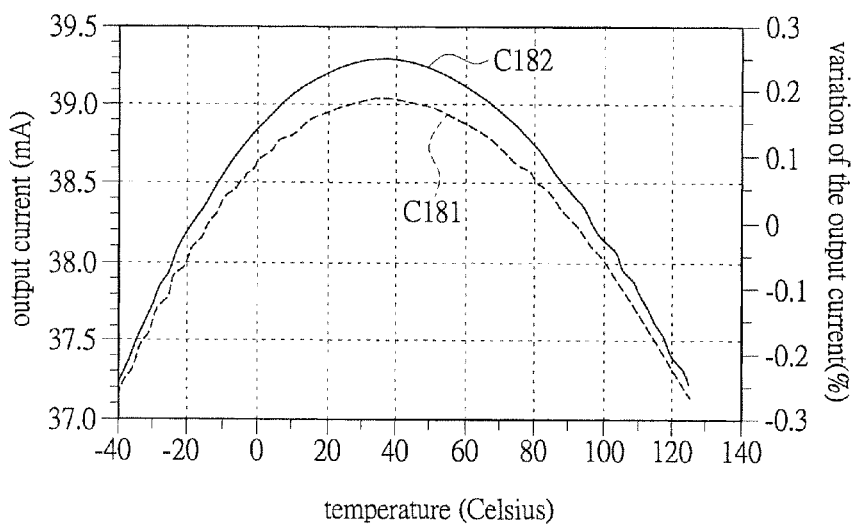
FIGS. 18A~18D shows a simulation curve view corresponding to an embodiment in FIG. 17.
Figure 18B:
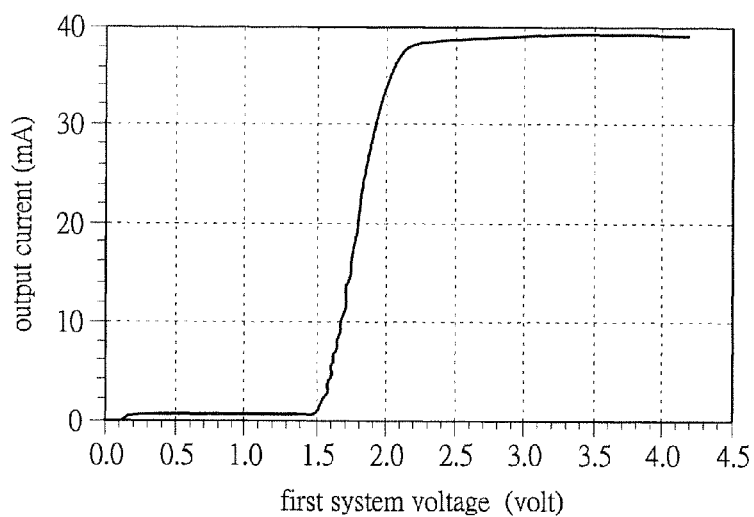
Figure 18C:
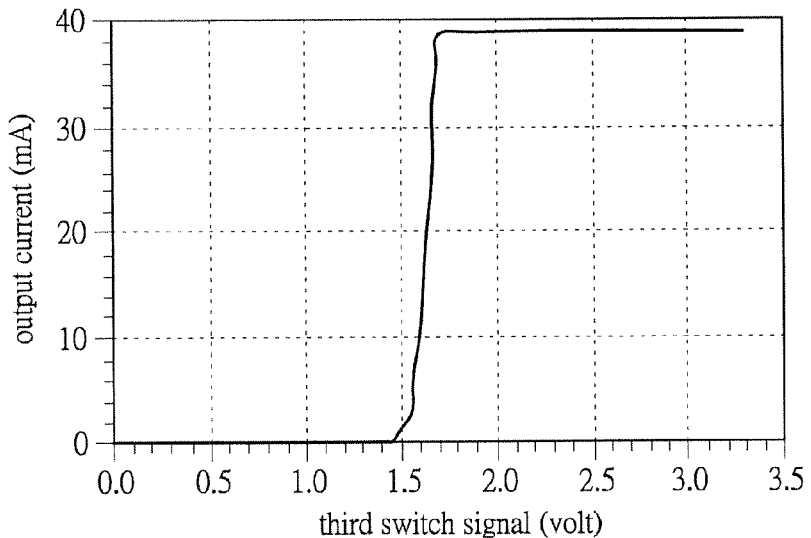
Figure 18D:
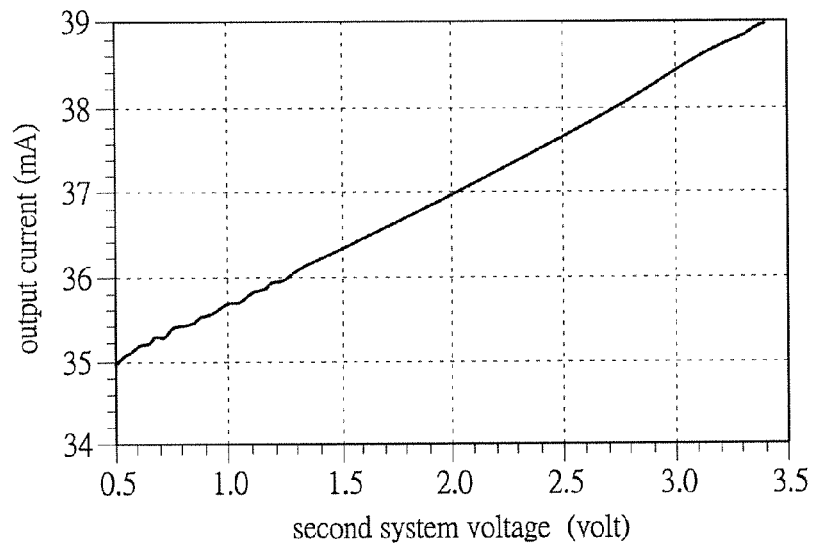

FIG. 17 shows a circuit schematic diagram of the RF power amplifier according to another one embodiment of the instant disclosure. Compared to the embodiment in FIG. 11, the fifteenth transistor Q15 is equivalent to the tenth transistor Q10 in FIG. 11, the second switching transistor QS2 and the second transistor Q2 are replaced by the third switch transistor QS3. A drain of the fifteenth transistor Q15 is coupled to the first system voltage VDD, and a gate of the fifteenth transistor Q15 is coupled to a source of the fifth transistor Q5. A drain of the third switch transistor QS3 is coupled to a source of the fifteenth transistor Q15, and a gate of the third switch transistor QS3 receives a third switch signal VS3, and a source of the third switch transistor QS3 is coupled to a terminal of the second resistor R2 or a terminal of the third resistor R3. In the embodiment, the fifteenth transistor Q15 and the third switch transistor QS3 are pseudo high electron mobility transistor (p-HEMT) with depletion-type, wherein the third switch transistor QS3 is determined to be switched on or off according to a voltage level of the third switch transistor VS3. Referring to FIG. 17 and FIGS. 18A-18D. As shown in FIG. 18A, when a temperature changes between minus 40 degrees Celsius and 120 degrees Celsius, a variation of the output current IC in the face of effect of temperature change is less than 3%. Therefore, the RF power amplifier 1700 of the present embodiment has a very good effect of temperature compensation, wherein a curve C181 shows the output current and a curve C182 shows a variation of the output current. As shown in FIG. 18B, when the first system voltage VDD increases to 2.6 volts, the output current IC will start showing phenomena of steady current. As shown in FIG. 18C, the third switch signal VS may maintain a switching logic level of 1.6 volt to meet the requirements of today's communication. In FIG. 18D, the output current IC also shows a great performance of high linearity when adjusting the second system voltage VCC through DC-to-DC, so that the output power of the RF power amplifier 1700 presents a high linearity to meet today's requirements for communication standard.

Figure 19:
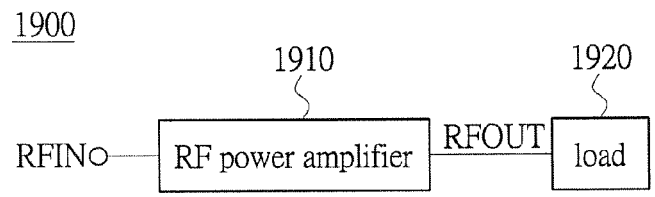
FIG. 19 shows a block view of an electronic system according to embodiment of the instant disclosure.

FIG. 19 shows a block view of an electronic system according to embodiment of the instant disclosure. The electronic system 1900 comprises a RF power amplifier 1910 and a load 1920. The RF power amplifier 1910 receives a RF input signal RFIN and outputs a RF output signal RFOUT to the load 1920; which means, after the RF power amplifier 1910 coupled to a system voltage, there is an output power stably provided to the load 1920. The RF power amplifier 1910 may be either of the RF power amplifiers 100, 200, 400, 600, 800, 1000, 1100, 1200, 1300, 1500 and 1700 of the embodiments in FIGS. 1, 2, 4, 6, 8, 10, 11, 12, 13, 15 and 18, providing an output power to the load 1920 stably. The electronic system 1900 may be a system in various kinds of electronic devices such as hand-held devices or portable devices.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A radio frequency power amplifier, comprising:
   a three-terminal current source circuit, receiving a first system voltage and accordingly outputting a first current and a second current, wherein a source voltage exists between a first output terminal and a second terminal;
      wherein the three-terminal current source circuit comprises: a first transistor, having a drain coupled to the first system voltage; and a first resistor, having a terminal being the first output terminal coupled to a source of the first transistor and outputting the first current, and another terminal being the second terminal coupled to a gate of the first transistor and outputting the second current, wherein the source voltage exists between the two terminals of the first resistor;
   a current mirror circuit, electrically connected to the three-terminal current source circuit, the current mirror circuit receiving the first current and the second current and accordingly generating a bias current; and
   an output-stage circuit, electrically connected to the current mirror circuit, the output-stage circuit receiving the bias current so as to operate at an operation point;
   wherein through the source voltage of the three-terminal current source circuit, when the first system voltage operates between a first voltage and a second voltage, the output-stage circuit outputs an output current with temperature-compensation which is stable with respect to changes of the first system voltage.

2. The radio frequency power amplifier according to claim 1, wherein the current mirror circuit comprises:
   a second transistor, having a base coupled to a terminal of the first resistor so as to receive the first current, and a collector coupled to the first system voltage;
   a second resistor, having a terminal coupled to an emitter of the second transistor;
   a third resistor, having a terminal coupled to an emitter of the second transistor; and
   a third transistor, having a base coupled to another terminal of the second resistor, a collector coupled to another terminal of the first resistor, and an emitter coupled to a ground voltage,
   wherein when the third transistor operates in an active region, a base voltage of the second transistor is a sum of base-emitter voltage of the second transistor, a voltage-drop of the second resistor and a base-emitter voltage of the third transistor, and the voltage of the first output terminal of the first resistor is locked at a base voltage of the second transistor.

3. The radio frequency power amplifier according to claim 2, wherein the output-stage circuit comprises:
   a fourth transistor, having a base coupled to another terminal of the third resistor so as to receive the bias current, a collector coupled to a second system voltage, and an emitter coupled to the ground voltage, wherein the fourth transistor is an output transistor configured to receive and amplify a radio frequency (RF) input signal and to provide an RF output signal.

4. The radio frequency power amplifier according to claim 3, further comprising a first switch transistor located in a current path of the first current, a drain of the first switch transistor is coupled to a terminal of the first resistor, a gate of the first switch transistor is coupled to a first switch signal, and a source of the first switch transistor is coupled to the base of the second transistor, wherein the first switch transistor is switched on or off according to a voltage level of the first switch signal.

5. The radio frequency power amplifier according to claim 2, further comprising:
   a fifth transistor between the first system voltage and the first transistor, a drain of the fifth transistor is coupled to the first system voltage, a gate of the fifth transistor is coupled to one terminal of the first resistor, a source of the fifth transistor is coupled to the drain of the first transistor, wherein the fifth transistor is configured to stabilize the first system voltage compared to a variation of the output current; and
   a second switch transistor, a drain of the second switch transistor is coupled to the drain of the first transistor, a gate of the second switch transistor receives a second switch signal, a source of the second switch transistor is coupled to the base of the second transistor, wherein the second switch transistor is switched on or off according to a voltage level of the second switch signal.

6. The radio frequency power amplifier according to claim 5, further comprises:
   a sixth transistor, having a drain coupled to the first system voltage;
   a seventh transistor, having a drain coupled to a source of the sixth transistor, and a gate coupled to another terminal of the first resistor;
   a fourth resistor, having a terminal coupled to a source of the seventh transistor, and another terminal coupled to a gate of the seventh transistor, wherein the sixth transistor, seventh transistor and the fourth resistor is configured as a current source circuit so as to increase the output current;
   a fifth resistor, having a terminal coupled to a terminal of the fourth resistor;
   an eighth transistor, having a collector coupled to another terminal of the fifth resistor, and a base coupled to a mode-switch signal through a sixth resistor, and an emitter coupled to the ground voltage, wherein the eighth transistor is a switch and is switched on or off according to the mode-switch signal,
   wherein, when the mode-switch signal is a low voltage level, the sixth transistor, the seventh transistor and the fourth resistor generate a third current that flows into the third transistor together with the second current so as to increase the output current, and when the mode-switch signal is a high voltage level, the second current flows into the third transistor so as to decrease the output current.

7. The radio frequency power amplifier according to claim 5, further comprising:
   a ninth transistor, having a drain coupled to the first system voltage, and a gate coupled to a terminal of the first resistor, and a source coupled to a drain of the second switch transistor and outputting the first current, wherein the ninth transistor is a depletion-type transistor configured to decrease a voltage of a terminal of the first resistor.

8. The radio frequency power amplifier according to claim 5, further comprising:
a tenth transistor, having a drain coupled to the first system voltage, and a gate coupled to a drain of the first transistor, and a source coupled to a drain of the second switch transistor and outputting the first current, wherein the tenth transistor is a depletion-type transistor and is configured to decrease a drain voltage of the first transistor.

9. The radio frequency power amplifier according to claim 3, wherein the first system voltage and the second system voltage are a supply voltage identically.

10. The radio frequency power amplifier according to claim 5, further comprising:
an eleventh transistor, having a collector coupled to a gate of the fifth transistor, and a base coupled to a source of the first transistor, wherein the collector and base of the eleventh transistor are coupled to each other;
a seventh resistor, having a terminal coupled to another terminal of the first resistor, and another terminal coupled to a emitter of the eleventh transistor and a collector of the third transistor; and
a twelfth transistor, having a gate coupled to a base of the third transistor, and a source coupled to the second switch transistor, and a drain coupled to the second switch signal, wherein when the third transistor operates in an active region, a gate voltage of the twelfth transistor is locked at a base voltage of the third transistor,
wherein a voltage between the first resistor and the seventh resistor is a base-emitter voltage of the eleventh transistor, and a voltage between the gate and the source of the first transistor is equal to a base-emitter voltage of the eleventh transistor multiplied by a first voltage-dividing resistor ratio, and the first voltage-dividing resistor ratio is a resistor value of the first resistor divided by a sum of the resistor value of the first resistor and a resistor value of the seventh resistor, and thus the second current and the bias current have approximately zero temperature coefficient for compensating a temperature effect of the output current.

11. The radio frequency power amplifier according to claim 5, further comprising:
an eighth resistor, having a terminal coupled to a terminal of the first resistor, and another terminal coupled to a gate of the first transistor;
a ninth resistor, having a terminal coupled to a terminal of the eighth resistor;
a thirteenth transistor, having a gate coupled to a terminal of the eighth resistor, and a drain and source coupled to a terminal of the ninth resistor, wherein the thirteen transistor is configured as a diode, so that a voltage across the eighth resistor and the ninth resistor is a diode voltage with negative coefficient; and
a fourteenth transistor, having a gate coupled to a base of the third resistor, and a drain coupled to a third switch signal, and a source coupled to a gate of the second switch transistor,
wherein a voltage between the gate and the source of the first transistor is the diode voltage multiplied by a second voltage-dividing resistor ratio, and the second voltage-dividing resistor ratio is a resistor value of the eighth resistor divided by a sum of the resistor value of the eighth resistor and a resistor value of the ninth resistor, and thus the second current and the bias current have approximately zero temperature coefficient for compensating a temperature effect of the output current.

12. An electronic system, comprising:
a radio frequency (RF) power amplifier receiving an RF input signal and outputting an RF output signal, the RF power amplifier comprising:
a three-terminal current source circuit, receiving a first system voltage and accordingly outputting a first current and a second current, wherein a source voltage exists between a first output terminal and a second terminal;
a current mirror circuit, electrically connected to the three-terminal current source circuit, the current mirror circuit receiving the first current and the second current and accordingly generating a bias current; and
an output-stage circuit, electrically connected to the current mirror circuit, the output-stage circuit receiving the bias current so as to operate at an operation point;
wherein the three-terminal current source circuit includes a first transistor having a drain coupled to the first system voltage; and a first resistor having a terminal being the first output terminal coupled to a source of the first transistor and outputting the first current, and another terminal being the second output terminal coupled to a gate of the first transistor and outputting the second current, wherein the source voltage exists between two terminal of the first resistor; and
wherein through the source voltage of the three-terminal current source circuit, when the first system voltage operates between a first voltage and a second voltage, the output-stage circuit outputs an output current with temperature-compensation which is stable with respect to changes of the first system voltage; and
a load, coupled to the RF power amplifier, the load receiving the RF output signal.

13. The electronic system according to claim 12, wherein the current mirror circuit comprises:
a second transistor, having a base coupled to a terminal of the first resistor so as to receive the first current, and a collector coupled to the first system voltage;
a second resistor, having a terminal coupled to an emitter of the second transistor;
a third resistor, having a terminal coupled to an emitter of the second transistor; and
a third transistor, having a base coupled to another terminal of the second resistor, a collector coupled to another terminal of the first resistor, and an emitter coupled to a ground voltage,
wherein when the third transistor operates in an active region, a base voltage of the second transistor is a sum of a base-emitter voltage of the second transistor, a voltage-drop of the second resistor and a base-emitter voltage of the third transistor, and the voltage of a terminal of the first resistor is locked at a base voltage of the second transistor.

14. The electronic system according to claim 13, wherein the output-stage circuit comprises:
a fourth transistor, having a base coupled to another terminal of the third resistor so as to receive the bias current, a collector coupled to a second system voltage, and an emitter coupled to the ground voltage, wherein the fourth transistor is an output transistor configured to receive and amplify a radio frequency (RF) input signal and provide an RF output signal.

15. The electronic system according to claim 14, further comprising a first switch transistor located in a current path of the first current, a drain of the first switch transistor is coupled to a terminal of the first resistor, a gate of the first switch transistor is coupled to a first switch signal, a source of the first switch transistor is coupled to the base of the second transistor, wherein the first switch transistor is switched on or off according to a voltage level of the first switch signal.

16. The electronic system according to claim 12, further comprising:
- a fifth transistor, a drain of the fifth transistor is coupled to the first system voltage, a gate of the fifth transistor is coupled to a terminal of the first resistor, a source of the fifth transistor is coupled to the drain of the first transistor, wherein the fifth transistor is configured to stabilize the first system voltage compared to a variation of the output current; and
- a second switch transistor, a drain of the second switch transistor is coupled to the drain of the first transistor, a gate of the second switch transistor receives a second switch signal, a source of the second switch transistor is coupled to the base of the second transistor, wherein the second switch transistor is switched on or off according to a voltage level of the second switch signal.

17. The radio frequency power amplifier according to claim 3, wherein an area of the fourth transistor is N times an area of the third transistor, and a resistor value of the second resistor is N times a resistor value of the third resistor, such that the output current of the output stage circuit is N times the second current, where N is a real number larger than one.

18. The electronic system according to claim 14, wherein an area of the fourth transistor is N times an area of the third transistor, and a resistor value of the second resistor is N times a resistor value of the third resistor, such that the output current is N times the second current, where N is a real number larger than one.

19. The radio frequency power amplifier according to claim 1, wherein the output-stage circuit outputs an output current with temperature-compensation which does not vary with changes of the first system voltage.

20. The radio frequency power amplifier according to claim 12, wherein the output-stage circuit outputs an output current with temperature-compensation which does not vary with changes of the first system voltage.

* * * * *